(12) United States Patent
Tendou et al.

(10) Patent No.: US 7,675,185 B2
(45) Date of Patent: Mar. 9, 2010

(54) EPOXY RESIN MOLDING MATERIAL FOR SEALING AND ELECTRONIC COMPONENT

(75) Inventors: Kazuyoshi Tendou, Tokyo (JP); Mitsuo Katayose, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 616 days.

(21) Appl. No.: 10/596,387

(22) PCT Filed: Dec. 6, 2004

(86) PCT No.: PCT/JP2004/018144

§ 371 (c)(1),
(2), (4) Date: Apr. 13, 2007

(87) PCT Pub. No.: WO2005/056676

PCT Pub. Date: Jun. 23, 2005

(65) Prior Publication Data

US 2007/0254986 A1 Nov. 1, 2007

(30) Foreign Application Priority Data

Dec. 11, 2003 (JP) .............................. 2003-413229
Sep. 8, 2004 (JP) .............................. 2004-260963

(51) Int. Cl.
*H01L 23/29* (2006.01)
*C08L 63/00* (2006.01)
*C08K 7/16* (2006.01)
*C08K 5/01* (2006.01)

(52) U.S. Cl. ..................... 257/789; 257/788; 257/793; 257/795; 523/440; 523/468

(58) Field of Classification Search ........................ None
See application file for complete search history.

(56) References Cited

U.S. PATENT DOCUMENTS

| 3,786,134 A | * | 1/1974 | Amagi et al. ............ 423/445 R |
| 3,951,904 A | * | 4/1976 | Tomonaga ..................... 523/137 |
| 6,528,559 B1 | | 3/2003 | Nakacho et al. |

FOREIGN PATENT DOCUMENTS

| JP | 60-119760 | 6/1985 |
| JP | 62-227955 | 10/1987 |
| JP | 63-179921 | 7/1988 |
| JP | 05-287052 | 11/1993 |
| JP | 06-184131 | 7/1994 |
| JP | 09-077846 | 3/1997 |
| JP | 10-259292 | 9/1998 |
| JP | 11-060904 | 3/1999 |
| JP | 2001-114986 A | * 4/2001 |
| JP | 2001-335620 | 12/2001 |
| JP | 2003-160713 | 6/2003 |
| JP | 2003-327792 | 11/2003 |
| JP | 2004-256687 | 9/2004 |
| KR | 2001-0074819 | 8/2001 |

OTHER PUBLICATIONS

Machine translation of JP 2001-114986, provided by the JPO website (2001).*
Machine translation of JP 2001-335620, provided by the JPO website (2001).*
Machine translation of JP 2003-327792, provided by the JPO website (2003).*
Microstructure of carbonaceous mesophase spherule; Higuchi et al.; Journal of Materials Science 19 (1984); pp. 270-278.*
Definition of "mesophase pitch" provided by the IUPAC Compendium of Chemical Terminology, 2nd Edition (1997).*
Definition of "pitch" provided by the IUPAC Compendium of Chemical Terminology, 2nd Edition (1997).*
Definition of "carbonaceous mesophase" provided by the IUPAC Compendium of Chemical Terminology, 2nd Edition (1997).*
Definition of "Brooks and Taylor structure" provided by the IUPAC Compendium of Chemical Terminology, 2nd Edition (1997).*
Office Action in corresponding Korean application No. 10-2006-7010224, mailed Apr. 23, 2007.
Office Action issued in the corresponding Chinese Application No. 200480031763.7 on Feb. 15, 2008.
International Search Report issued in corresponding application No. PCT/JP2004/018144 completed Feb. 21, 2005 and mailed Mar. 8, 2005.
Chemical Dictionary 4, published by Kyoritsu Shuppan Co., Ltd., compact edition, 30th printing, Feb. 15, 1987.
Office Action issued in Japanese Patent Application No. 2005-516103, completed Nov. 6, 2009, mailed Nov. 10, 2009 with English translation.

* cited by examiner

*Primary Examiner*—Michael J Feely
(74) *Attorney, Agent, or Firm*—Griffin & Szipl, P.C.

(57) ABSTRACT

An epoxy resin molding material for sealing which comprises an epoxy resin, an epoxy resin curing agent, and a pitch, as well as an electronic component comprising an element that is sealed with the molding material. This molding material exhibits favorable coloring properties, and even when used in packages with narrow distances between pads or wires, shorting defects caused by conductive materials can be prevented, as the molding material contains no conductive carbon black.

13 Claims, No Drawings

EPOXY RESIN MOLDING MATERIAL FOR SEALING AND ELECTRONIC COMPONENT

This is a National Phase Application in the United States of International Patent Application No. PCT/JP2004/018144 filed Dec. 6, 2004, which claims priority on Japanese Patent Applications No. 2003-413229, filed Dec. 11, 2003 and 2004-260963, filed Sep. 8, 2004. The entire disclosures of the above patent applications are hereby incorporated by reference.

TECHNICAL FIELD

The present invention relates to an epoxy resin molding material for sealing, which can be used favorably as a sealing material for electronic components, and which suffers no shorting defects caused by conductive materials, even when used with electronic components such as semiconductor devices with particularly narrow distances between pads or wires, and also relates to an electronic component that includes an element that is sealed with this epoxy resin molding material for sealing.

BACKGROUND ART

Conventionally, in the field of element sealing for electronic components such as transistors and ICs, resin sealing is commonly used for reasons of productivity and cost and the like, and epoxy resin molding materials are widely used. The reason for this widespread use is that epoxy resins are able to offer a favorable balance across many characteristics, including the electrical properties, moisture resistance, heat resistance, mechanical properties, and adhesion to inserts.

In recent years, as the packaging of electronic components on printed wiring boards has increased in density, the most common configuration for these electronic components is changing from conventional pin insertion-type packages to surface mounted packages. In order to increase the packaging density and lower the mounting height, surface mounted ICs and LSIs and the like have become thinner and smaller, the occupied volume of the elements relative to the package has increased, and the thickness of the package has become extremely small.

In order to cope with a shift towards even smaller and lighter packages, the package configuration is also changing from packages known as QFP (Quad Flat Package) and SOP (Small Outline Package) to area-mounted packages such as BGA (Ball Grid Array) that include CSP (Chip Size Package) which are more readily able to cope with increased numbers of pins, and enable even higher density packaging. Recently, in order to realize increased speed and multi-functionality, packages with new structures are being developed, including face down packages, stacked packages, flip-chip packages, and wafer level packages. Many of these packages have a single side sealing-type package structure, wherein only the surface on the side to which the elements are mounted is sealed with a sealing material such as an epoxy resin molding material, and solder balls are then formed on the rear surface to join the package to a circuit board.

As these types of packages are reduced in size and the number of pins is increased, the pitch distances between inner leads, pads, and wires and the like are narrowing at a rapid rate. As a result, the fact that carbon black, which has conventionally been used as a colorant, has an inherent conductivity has led to a problem in that aggregates of carbon black can become lodged between inner leads, pads, and wires, causing electrical defects.

Accordingly, methods in which organic dyes, organic pigments, and inorganic pigments are used instead of carbon black have been investigated (see Japanese Patent Laid-Open No. Sho 60-119760, Japanese Patent Laid-Open No. Sho 63-179921, Japanese Patent Laid-Open No. Hei 11-60904, and Japanese Patent Laid-Open No. 2003-160713).

However, these methods suffer various problems, including a deterioration in the coloring properties, a deterioration in curability, and increased costs, and have been unable to achieve a satisfactory level of performance.

DISCLOSURE OF INVENTION

The present invention aims to provide an epoxy resin molding material for sealing, which exhibits favorable coloring properties, and suffers no shorting defects caused by conductive materials, even when used in packages with narrow distances between pads or wires, as well as an electronic component that includes an element that is sealed with this epoxy resin molding material for sealing.

Accordingly, a first aspect of the present invention provides an epoxy resin molding material for sealing, comprising an epoxy resin, an epoxy resin curing agent, and a pitch.

A second aspect of the present invention provides an electronic component comprising an element that is sealed with the epoxy resin molding material for sealing according to the above first aspect of the present invention.

Because the epoxy resin molding material for sealing according to the present invention contains a pitch as the colorant, the coloring properties are favorable, and the material suffers no shorting defects caused by conductive materials, thus yielding a sealing material with excellent reliability and electrical properties. Accordingly, this material can be used to produce an electronic component with excellent reliability and electrical properties, meaning the industrial value of the material is significant.

BEST MODE FOR CARRYING OUT THE INVENTION

The pitch used in the present invention is a generic name for the residue obtained when the high boiling point by-products and the like from the petroleum industry such as coal tar and asphalt are subjected to dry distillation at a temperature of 360° C. or higher. In terms of chemical composition, pitch is a mixture comprising compounds with structural elements composed mainly of aromatic structures, and although able to be melted, exists in the solid state at room temperature. Different varieties of pitch, which vary in accordance with the nature of the raw materials, include coal pitch, petroleum pitch, naphthalene pitch, and acetylene pitch. In addition, depending on the treatment temperature and the treatment time, these pitches are classified as optically isotropic pitch, mesophase pitch, or liquid crystalline pitch.

Microspherical carbon materials are formed within a mesophase pitch. These microspheres can be isolated as an insoluble component when the mesophase pitch is dissolved in quinoline or the like. These microspheres isolated from the mesophase pitch are mesophase microspheres.

Although any of the pitches described above may be used as the pitch, from the viewpoints of achieving favorable dispersibility within the epoxy resin molding material for sealing (hereafter also referred to as simply "the molding material") and favorable coloring properties, a finely ground microparticulate pitch is preferred, mesophase microspheres are even more preferred, and mesophase microspheres isolated from a coal mesophase pitch are the most desirable. An example of a commercially available product containing these types of mesophase microspheres is the product "MCMB Green" manufactured by Osaka Gas Chemicals Co., Ltd.

The average particle size of the pitch is preferably no larger than 30 μm, and is even more preferably 10 μm or smaller. Measurement of the average particle size can be conducted using a conventional method such as laser diffractometry. Smaller values for the pitch particle size can be shown to yield improved coloring performance.

From the viewpoint of preventing the occurrence of shorting defects within an electronic component containing an element that is sealed with this molding material, the electrical resistivity of the pitch is preferably at least $1 \times 10^5 \Omega \cdot cm$, even more preferably $1 \times 10^6 \Omega \cdot cm$ or greater, and most preferably $1 \times 10^7 \Omega \cdot cm$ or greater. The electrical resistivity can be determined in accordance with the "method of measuring electrical resistivity of acetylene black" described in JIS K1469.

In addition, the carbon content of the pitch is preferably within a range from 88% by weight to 96% by weight, and is even more preferably from 90% by weight to 94% by weight. If the carbon content is lower than 88% by weight, then the coloring properties tend to deteriorate, whereas if the carbon content is higher than 96% by weight, the electrical resistivity tends to decrease.

Provided the effects of the present invention can still be achieved, other colorants (colorants that do not contain pitch) are preferably also used in the molding material. Examples of other colorants that can be used in combination with the pitch include dyes such as azo-based dyes, anthraquinone-based dyes, and phthalocyanine-based dyes; organic pigments such as azine-based pigments, azo-based pigments, anthraquinone-based pigments, diimonium-based pigments, diiminium-based pigments, phthalocyanine-based pigments, and metal salt-based pigments; metal oxide-based inorganic pigments of metals such as Al, Mg, Fe, and Ti; composite metal oxide-based pigments of metals such as Cu, Cr, and Mn; and carbon black. Of these, from the viewpoint of the resulting coloring properties, the use of either a phthalocyanine-based dye, or one or more colorants selected from amongst phthalocyanine-based pigments, aniline black, perylene black, black iron oxide, and black titanium oxide is preferred, and from the viewpoint of laser markability, black titanium oxide is particularly preferred.

Titanium oxide ($TiO_2$) is normally known as a white pigment with excellent covering properties, but can be converted to black titanium oxide by reduction at high temperature to remove a portion of the oxygen from within the titanium oxide. An example of a commercially available product of this type of black titanium oxide is the product "titanium black" manufactured by Jemco Inc.

There are no particular restrictions on the combined blend quantity of the pitch and the colorants that do not contain pitch (the colorants other than pitch), provided the molding material can be colored black, but blend quantities within a range from 2% by weight to 15% by weight relative to the epoxy resin are preferred, and blend quantities from 3% by weight to 10% by weight are even more desirable.

There are no particular restrictions on the quantity of pitch added, provided the effects of the present invention can be achieved, but from the viewpoints of achieving favorable coloring properties and preventing shorting defects, the quantity of pitch is preferably at least 30% by weight, even more preferably 45% by weight or greater, and most preferably 60% by weight or greater, of the pitch and the colorants that do not contain pitch (that is, relative to the combined quantity of the pitch and the colorants that do not contain pitch).

There are no particular restrictions on the epoxy resin used in the molding material, provided the compound comprises at least two epoxy groups within each molecule.

Suitable examples include novolak type epoxy resins (such as phenol novolak type epoxy resins, ortho-cresol novolak type epoxy resins, and epoxy resins with a triphenylmethane skeleton) produced by the epoxidation of a novolak resin obtained by the condensation or co-condensation of a phenol such as phenol, cresol, xylenol, resorcinol, catechol, bisphenol A, or bisphenol F, and/or a naphthol such as α-naphthol, β-naphthol, or dihydroxynaphthalene, with a compound having an aldehyde group such as formaldehyde, acetaldehyde, propionaldehyde, benzaldehyde, or salicylaldehyde, in the presence of an acid catalyst; diglycidyl ethers of alkyl-substituted, aromatic ring-substituted or unsubstituted bisphenol A, bisphenol F, bisphenol S, biphenol, or thiodiphenol; stilbene type epoxy resins; hydroquinone type epoxy resins; glycidyl ester type epoxy resins obtained by the reaction of a polybasic acid such as phthalic acid or dimer acid with epichlorohydrin; glycidylamine type epoxy resins obtained by the reaction of a polyamine such as diaminodiphenylmethane or isocyanuric acid with epichlorohydrin; epoxidation products of co-condensation resins of dicyclopentadiene and a phenol; epoxy resins having a naphthalene ring; epoxidation products of aralkyl type phenolic resins, such as phenol-aralkyl resins and naphthol-aralkyl resins synthesized from a phenol and/or a naphthol, and dimethoxyparaxylene or bis(methoxymethyl)biphenyl; trimethylolpropane type epoxy resins; terpene-modified epoxy resins; linear aliphatic epoxy resins obtained by the oxidation of olefinic bonds with a peracid such as peracetic acid; alicyclic epoxy resins; and sulfur atom-containing epoxy resins. These resins may be used either alone, or in combinations of two or more different resins.

Of these, from the viewpoint of achieving a favorable combination of fluidity and curability, the resin preferably incorporates a biphenyl type epoxy resin, which is a diglycidyl ether of an alkyl-substituted, aromatic ring-substituted, or unsubstituted biphenol. From the viewpoint of achieving a favorable combination of fluidity and flame retardancy, the resin preferably incorporates a bisphenol F type epoxy resin, which is a diglycidyl ether of an alkyl-substituted, aromatic ring-substituted, or unsubstituted bisphenol F. From the viewpoint of achieving a favorable combination of fluidity and reflow characteristics, the resin preferably incorporates a thiodiphenol type epoxy resin, which is a diglycidyl ether of an alkyl-substituted, aromatic ring-substituted, or unsubstituted thiodiphenol. From the viewpoint of achieving a favorable combination of curability and flame retardancy, the resin preferably incorporates an epoxidation product of a phenol-aralkyl resin synthesized from an alkyl-substituted, aromatic ring-substituted, or unsubstituted phenol and bis(methoxymethyl)biphenyl. From the viewpoint of achieving a favorable combination of storage stability and flame retardancy, the resin preferably incorporates an epoxidation product of a naphthol-aralkyl resin synthesized from an alkyl-substituted, aromatic ring-substituted, or unsubstituted naphthol and dimethoxyparaxylene.

In other words, the epoxy resin preferably comprises at least one resin selected from the group consisting of biphenyl type epoxy resins, bisphenol F type epoxy resins, thiodiphenol type epoxy resins, phenol-aralkyl type epoxy resins, and naphthol-aralkyl type epoxy resins.

Examples of suitable biphenyl type epoxy resins include the epoxy resins represented by a general formula (III) shown below.

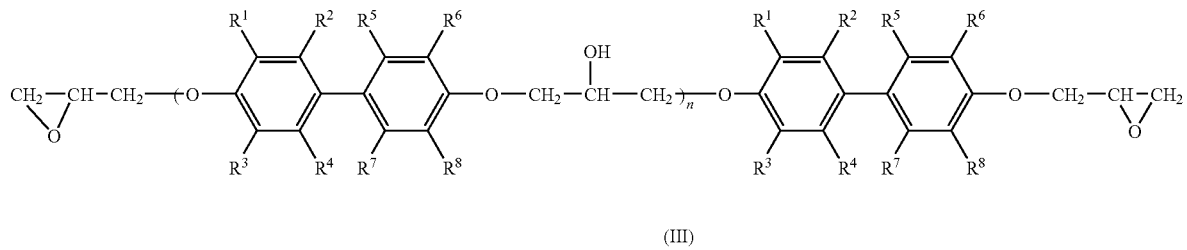

(III)

(wherein, $R^1$ to $R^8$ each represent a hydrogen atom, or a substituted or unsubstituted monovalent hydrocarbon group of 1 to 10 carbon atoms, which may be all the same, or may be different. n represents either 0 or an integer from 1 to 3.)

The biphenyl type epoxy resins represented by the above general formula (III) can be obtained by reacting epichlorohydrin with a biphenol compound using a conventional method. Examples of $R^1$ to $R^8$ within the general formula (III) include a hydrogen atom; alkyl groups of 1 to 10 carbon atoms such as a methyl group, ethyl group, propyl group, butyl group, isopropyl group, isobutyl group, or t-butyl group; and alkenyl groups of 1 to 10 carbon atoms such as a vinyl group, allyl group, or butenyl group, although of these, a hydrogen atom or a methyl group is preferred.

Examples of this type of epoxy resin include epoxy resins comprising 4,4'-bis(2,3-epoxypropoxy)biphenyl or 4,4'-bis(2,3-epoxypropoxy)-3,3',5,5'-tetramethylbiphenyl as the principal component; and epoxy resins obtained by the reaction of epichlorohydrin with either 4,4'-biphenol or 4,4'-(3,3',5,5'-tetramethyl)biphenol. Of these, epoxy resins comprising 4,4'-bis(2,3-epoxypropoxy)-3,3',5,5'-tetramethylbiphenyl as the principal component are particularly preferred. These types of epoxy resins are available as commercial products, including the product "YX-4000" manufactured by Japan Epoxy Resins Co., Ltd.

In order to ensure adequate manifestation of the resin properties, the blend quantity of the above biphenyl type epoxy resin is preferably at least 20% by weight, even more preferably 30% by weight or greater, and most preferably 50% by weight or greater, relative to the total weight of the epoxy resin.

Examples of suitable bisphenol F type epoxy resins include the epoxy resins represented by a general formula (IV) shown below.

(wherein, $R^1$ to $R^8$ each represent a hydrogen atom, or a substituted or unsubstituted monovalent hydrocarbon group of 1 to 10 carbon atoms, which may be all the same, or may be different. n represents either 0 or an integer from 1 to 3.)

The bisphenol F type epoxy resins represented by the above general formula (IV) can be obtained by reacting epichlorohydrin with a bisphenol F compound using a conventional method. Examples of $R^1$ to $R^8$ within the general formula (IV) include a hydrogen atom; alkyl groups of 1 to 10 carbon atoms such as a methyl group, ethyl group, propyl group, butyl group, isopropyl group, isobutyl group, or t-butyl group; and alkenyl groups of 1 to 10 carbon atoms such as a vinyl group, allyl group, or butenyl group, although of these, a hydrogen atom or a methyl group is preferred.

Examples of this type of epoxy resin include epoxy resins comprising the diglycidyl ether of 4,4'-methylenebis(2,6-dimethylphenol) as the principal component; epoxy resins comprising the diglycidyl ether of 4,4'-methylenebis(2,3,6-trimethylphenol) as the principal component; and epoxy resins comprising the diglycidyl ether of 4,4'-methylenebisphenol as the principal component, and of these, epoxy resins comprising the diglycidyl ether of 4,4'-methylenebis(2,6-dimethylphenol) as the principal component are particularly preferred. These types of epoxy resins are available as commercial products, including the product "YSLV-80XY" manufactured by Nippon Steel Chemical Group.

In order to ensure adequate manifestation of the resin properties, the blend quantity of the above bisphenol F type epoxy resin is preferably at least 20% by weight, even more preferably 30% by weight or greater, and most preferably 50% by weight or greater, relative to the total weight of the epoxy resin.

Examples of suitable thiodiphenol type epoxy resins include the epoxy resins represented by a general formula (V) shown below.

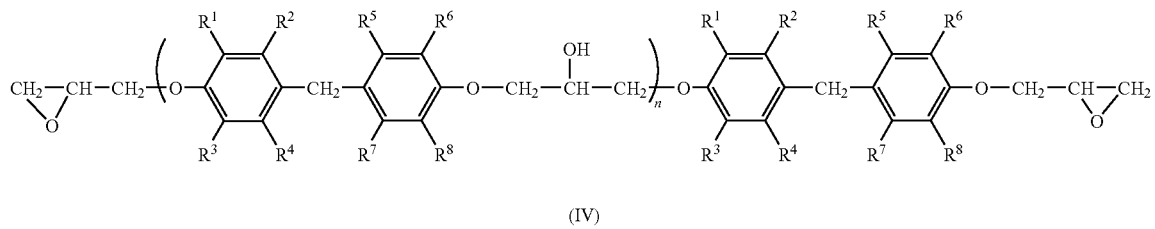

(IV)

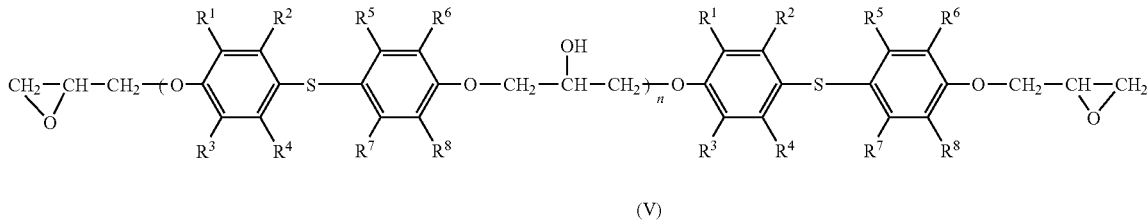

(V)

(wherein, $R^1$ to $R^8$ each represent a hydrogen atom, or a substituted or unsubstituted monovalent hydrocarbon group of 1 to 10 carbon atoms, which may be all the same, or may be different. n represents either 0 or an integer from 1 to 3.)

The thiodiphenol type epoxy resins represented by the above general formula (V) can be obtained by reacting epichlorohydrin with a thiodiphenol compound using a conventional method. Examples of $R^1$ to $R^8$ within the general formula (V) include a hydrogen atom; alkyl groups of 1 to 10 carbon atoms such as a methyl group, ethyl group, propyl group, butyl group, isopropyl group, isobutyl group, or t-butyl group; and alkenyl groups of 1 to 10 carbon atoms such as a vinyl group, allyl group, or butenyl group, although of these, a hydrogen atom, methyl group, or t-butyl group is preferred.

Examples of this type of epoxy resin include epoxy resins comprising the diglycidyl ether of 4,4'-dihydroxydiphenyl sulfide as the principal component; epoxy resins comprising the diglycidyl ether of 2,2',5,5'-tetramethyl-4,4'-dihydroxydiphenyl sulfide as the principal component; and epoxy resins comprising the diglycidyl ether of 2,2'-dimethyl-4,4'-dihydroxy-5,5'-di-t-butyldiphenyl sulfide as the principal component. Of these, epoxy resins comprising the diglycidyl ether of 2,2'-dimethyl-4,4'-dihydroxy-5,5'-di-t-butyldiphenyl sulfide as the principal component are particularly preferred. These types of epoxy resins are available as commercial products, including the product "YSLV-120TE" manufactured by Nippon Steel Chemical Group.

In order to ensure adequate manifestation of the resin properties, the blend quantity of the above thiodiphenol type epoxy resin is preferably at least 20% by weight, even more preferably 30% by weight or greater, and most preferably 50% by weight or greater, relative to the total weight of the epoxy resin.

Examples of suitable epoxidation products of phenol-aralkyl resins (phenol-aralkyl type epoxy resins) include the epoxy resins represented by a general formula (VI) shown below.

(wherein, $R^1$ to $R^9$ each represent a hydrogen atom, or a substituted or unsubstituted monovalent hydrocarbon group of 1 to 12 carbon atoms, which may be all the same, or may be different. i represents either 0 or an integer from 1 to 3, and n represents either 0 or an integer from 1 to 10.)

The epoxidation products of phenol-aralkyl resins represented by the above general formula (VI) can be obtained by using a conventional method to react epichlorohydrin with a phenol-aralkyl resin synthesized from an alkyl-substituted, aromatic ring-substituted, or unsubstituted phenol and bis(methoxymethyl)biphenyl. Examples of $R^1$ to $R^9$ within the general formula (VI) include chain-like alkyl groups such as a methyl group, ethyl group, propyl group, isopropyl group, n-butyl group, sec-butyl group, t-butyl group, pentyl group, hexyl group, octyl group, decyl group, or dodecyl group; cyclic alkyl groups or cyclic alkenyl groups such as a cyclopentyl group, cyclohexyl group, cycloheptyl group, cyclopentenyl group, or cyclohexenyl group; aryl group-substituted alkyl groups such as a benzyl group or phenethyl group; alkoxy group-substituted alkyl groups such as methoxy group-substituted alkyl groups, ethoxy group-substituted alkyl groups, or butoxy group-substituted alkyl groups; alkyl groups substituted with amino group such as a dimethylamino group or diethylamino group; hydroxyl group-substituted alkyl groups; unsubstituted aryl groups such as a phenyl group, naphthyl group, or biphenyl group; alkyl group-substituted aryl groups such as a tolyl group, dimethylphenyl group, ethylphenyl group, butylphenyl group, t-butylphenyl group, or dimethylnaphthyl group; alkoxy group-substituted aryl groups such as a methoxyphenyl group, ethoxyphenyl group, butoxyphenyl group, t-butoxyphenyl group, or methoxynaphthyl group; aryl groups substituted with amino group such as a dimethylamino group or diethylamino group; and hydroxyl group-substituted aryl groups.

Of these, $R^1$ to $R^9$ preferably represent either a hydrogen atom or a methyl group, and preferred resins include the epoxidation products of phenol-aralkyl resins represented by a general formula (VII) shown below.

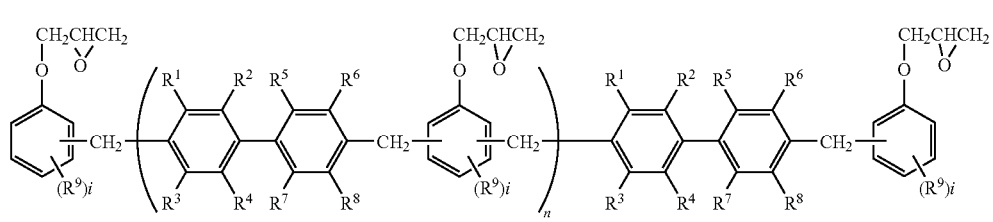

(VI)

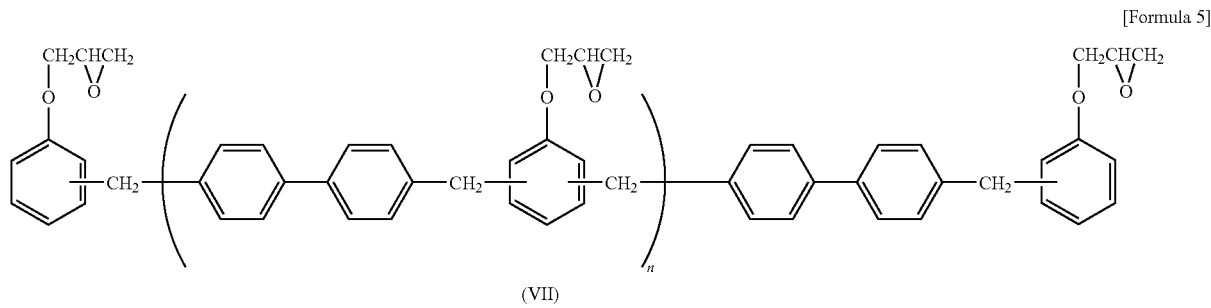

(VII)

(wherein, n represents either 0 or an integer from 1 to 10.)

In the above formula, on average, n is preferably no greater than 6.

These types of epoxy resins are available as commercial products, including the products "NC-3000S" and "CER-3000L" manufactured by Nippon Kayaku Co., Ltd. (a mixture of a phenol-aralkyl resin of the general formula (VII) and 4,4'-bis(2,3-epoxypropoxy)biphenyl (with a mixture weight ratio of 8/2)).

In order to ensure adequate manifestation of the resin properties, the blend quantity of the above epoxidation product of a phenol-aralkyl resin is preferably at least 20% by weight, even more preferably 30% by weight or greater, and most preferably 50% by weight or greater, relative to the total weight of the epoxy resin.

Examples of suitable epoxidation products of naphthol-aralkyl resins (naphthol-aralkyl type epoxy resins) include the epoxy resins represented by a general formula (VIII) shown below.

either dimethoxyparaxylene or bis(methoxymethyl)biphenyl. Examples of R within the general formula (VIII) include chain-like alkyl groups such as a methyl group, ethyl group, propyl group, isopropyl group, n-butyl group, sec-butyl group, t-butyl group, pentyl group, hexyl group, octyl group, decyl group, or dodecyl group; cyclic alkyl groups such as a cyclopentyl group, cyclohexyl group, cycloheptyl group, cyclopentenyl group, or cyclohexenyl group; aryl group-substituted alkyl groups such as a benzyl group or phenethyl group; alkoxy group-substituted alkyl groups such as methoxy group-substituted alkyl groups, ethoxy group-substituted alkyl groups, or butoxy group-substituted alkyl groups; alkyl groups substituted with amino group such as a dimethylamino group or diethylamino group; hydroxyl group-substituted alkyl groups; unsubstituted aryl groups such as a phenyl group, naphthyl group, or biphenyl group; alkyl group-substituted aryl groups such as a tolyl group, dimethylphenyl

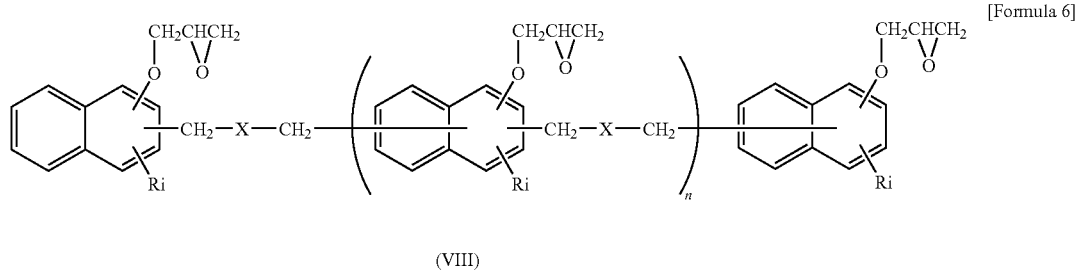

(VIII)

(wherein, each R represents a hydrogen atom, or a substituted or unsubstituted monovalent hydrocarbon group of 1 to 12 carbon atoms, which may be all the same, or may be different. i represents either 0 or an integer from 1 to 3, X represents a bivalent organic group that contains an aromatic ring, and n represents either 0 or an integer from 1 to 10.)

The epoxidation products of naphthol-aralkyl resins represented by the above general formula (VIII) can be obtained by using a conventional method to react epichlorohydrin with a naphthol-aralkyl resin synthesized from an alkyl-substituted, aromatic ring-substituted, or unsubstituted naphthol, and group, ethylphenyl group, butylphenyl group, t-butylphenyl group, or dimethylnaphthyl group; alkoxy group-substituted aryl groups such as a methoxyphenyl group, ethoxyphenyl group, butoxyphenyl group, t-butoxyphenyl group, or methoxynaphthyl group; aryl groups substituted with amino group such as a dimethylamino group or diethylamino group; and hydroxyl group-substituted aryl groups.

Of these, R preferably represents either a hydrogen atom or a methyl group, and preferred resins include the epoxidation products of naphthol-aralkyl resins represented by a general formula (IX) or a general formula (X) shown below.

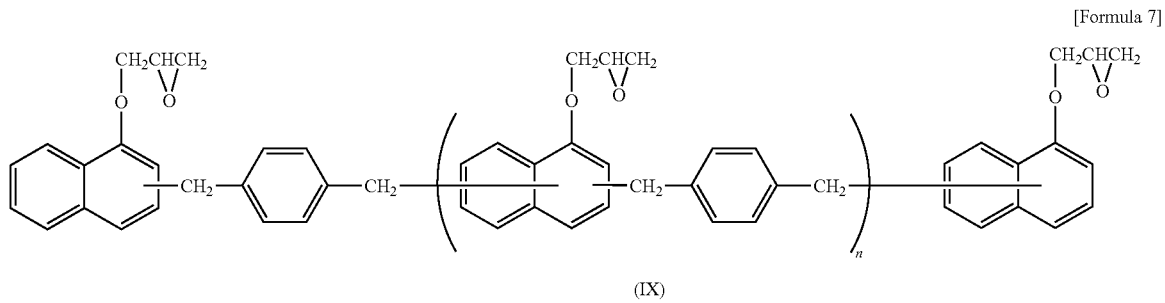

(IX)

(wherein, n represents either 0 or an integer from 1 to 10.)

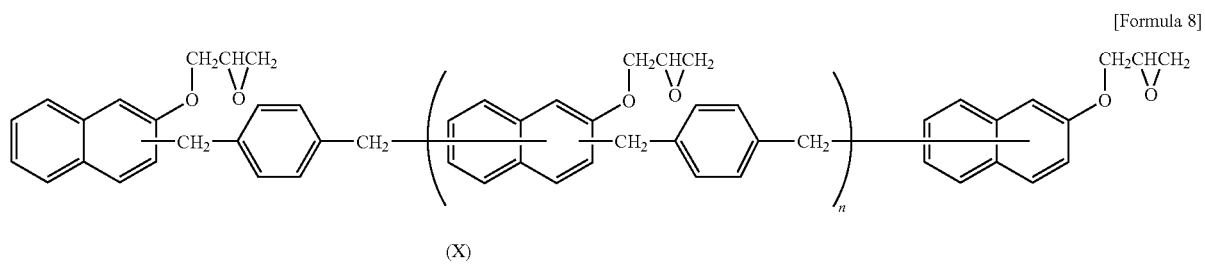

(X)

(wherein, n represents either 0 or an integer from 1 to 10.)

In the above general formulas (IX) and (X), on average, n is preferably no greater than 6.

The epoxy resins represented by the above general formula (IX) are available as commercial products, including the product "ESN-375" manufactured by Nippon Steel Chemical Group. The epoxy resins represented by the above general formula (X) are also available as commercial products, including the product "ESN-175" manufactured by Nippon Steel Chemical Group.

In order to ensure adequate manifestation of the resin properties, the blend quantity of the above epoxidation product of a naphthol-aralkyl resin is preferably at least 20% by weight, even more preferably 30% by weight or greater, and most preferably 50% by weight or greater, relative to the total weight of the epoxy resin.

These biphenyl type epoxy resins, bisphenol F type epoxy resins, thiodiphenol type epoxy resins, phenol-aralkyl type epoxy resins, and naphthol-aralkyl type epoxy resins may be used either alone, or in combinations of two or more different resins. If two or more different resins are combined, then in order to ensure adequate manifestation of the resin properties, the combined quantity of the resins is preferably at least 20% by weight, even more preferably 30% by weight or greater, and most preferably 50% by weight or greater, relative to the total weight of the epoxy resin.

This molding material includes a curing agent. There are no particular restrictions on the curing agent used, and any curing agent typically used in epoxy resin molding materials for sealing is suitable.

Suitable examples include novolak type phenolic resins obtained by the condensation or co-condensation of a phenol such as phenol, cresol, xylenol, resorcinol, catechol, bisphenol A, or bisphenol F, thiodiphenol, phenylphenol, or aminophenol, and/or a naphthol such as α-naphthol, β-naphthol, or dihydroxynaphthalene, with a compound having an aldehyde group such as formaldehyde, acetaldehyde, propionaldehyde, benzaldehyde, or salicylaldehyde, in the presence of an acid catalyst; aralkyl type phenolic resins such as phenol-aralkyl resins and naphthol-aralkyl resins synthesized from a phenol and/or a naphthol, and either dimethoxyparaxylene or bis(methoxymethyl)biphenyl; paraxylylene and/or meta-xylylene modified phenolic resins; substituted or unsubstituted melamine-modified phenolic resins; terpene-modified phenolic resins; dicyclopentadiene-modified phenolic resins; cyclopentadiene-modified phenolic resins; and polyaromatic ring-modified phenolic resins. These curing agents may be used either alone, or in combinations of two or more different compounds.

Of these, from the viewpoint of flame retardancy, the curing agent preferably comprises either one, or two or more phenol-aralkyl resins or naphthol-aralkyl resins.

Examples of suitable phenol-aralkyl resins include the resins represented by a general formula (I) shown below.

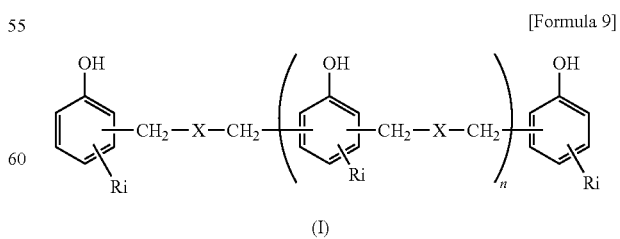

(I)

(wherein, each R represents a hydrogen atom, or a substituted or unsubstituted monovalent hydrocarbon group of 1 to 12 carbon atoms, which may be all the same, or may be different. i represents either 0 or an integer from 1 to 3, X represents a bivalent organic group that contains an aromatic ring, and n represents either 0 or an integer from 1 to 10.)

Examples of the group R within the above general formula (I) include chain-like alkyl groups such as a methyl group, ethyl group, propyl group, isopropyl group, n-butyl group, sec-butyl group, t-butyl group, pentyl group, hexyl group, octyl group, decyl group, or dodecyl group; cyclic alkyl groups such as a cyclopentyl group, cyclohexyl group, cycloheptyl group, cyclopentenyl group, or cyclohexenyl group; aryl group-substituted alkyl groups such as a benzyl group or phenethyl group; alkoxy group-substituted alkyl groups such as methoxy group-substituted alkyl groups, ethoxy group-substituted alkyl groups, or butoxy group-substituted alkyl groups; alkyl groups substituted with amino group such as a biphenylene group, or naphthylene group; alkyl group-substituted arylene groups such as a tolylene group or xylylene group; alkoxyl group-substituted arylene groups; aralkyl groups such as a benzyl group or phenethyl group; and aralkyl group-substituted arylene groups.

Of these, from the viewpoint of achieving a favorable combination of flame retardancy, fluidity, and curability, X is preferably a substituted or unsubstituted phenylene group, so that, for example, the phenol-aralkyl resins represented by a general formula (XI) shown below are preferred.

From the viewpoint of achieving a favorable combination of flame retardancy and reflow resistance, X is preferably a substituted or unsubstituted biphenylene group, so that, for example, the phenol-aralkyl resins represented by a general formula (XII) shown below are preferred.

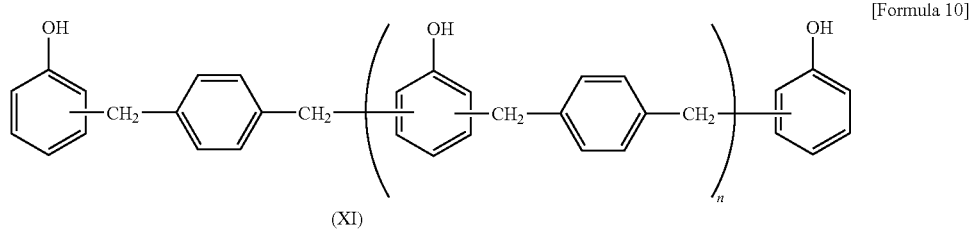

[Formula 10]

(XI)

(wherein, n represents either 0 or an integer from 1 to 10.)

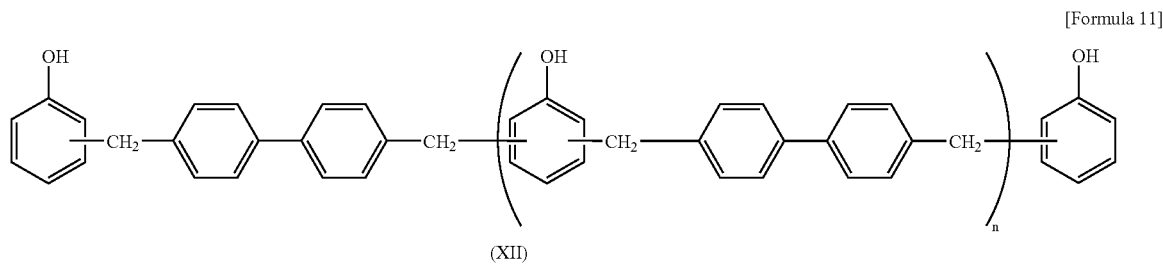

[Formula 11]

(XII)

dimethylamino group or diethylamino group; hydroxyl group-substituted alkyl groups; unsubstituted aryl groups such as a phenyl group, naphthyl group, or biphenyl group; alkyl group-substituted aryl groups such as a tolyl group, dimethylphenyl group, ethylphenyl group, butylphenyl group, t-butylphenyl group, or dimethylnaphthyl group; alkoxy group-substituted aryl groups such as a methoxyphenyl group, ethoxyphenyl group, butoxyphenyl group, t-butoxyphenyl group, or methoxynaphthyl group; aryl groups substituted with amino group such as a dimethylamino group or diethylamino group; and hydroxyl group-substituted aryl groups.

Of these, R is preferably a hydrogen atom or a methyl group.

The group X within the above general formula (I) represents a group that contains an aromatic ring, and suitable examples include arylene groups such as a phenylene group, (wherein, n represents either 0 or an integer from 1 to 10.)

In the above general formulas (XI) and (XII), on average, n is preferably no greater than 6.

An example of a commercially available product of a phenol-aralkyl resin represented by the above general formula (XI) is the product "XLC" manufactured by Mitsui Chemicals, Inc. An example of a commercially available product of a phenol-aralkyl resin represented by the above general formula (XII) is the product "MEH-7851" manufactured by Meiwa Plastic Industries, Ltd.

In order to ensure adequate manifestation of the resin properties, the blend quantity of the above phenol-aralkyl resin is preferably at least 20% by weight, even more preferably 30% by weight or greater, and most preferably 50% by weight or greater, relative to the total weight of the curing agent.

Examples of suitable naphthol-aralkyl resins include the resins represented by a general formula (II) shown below.

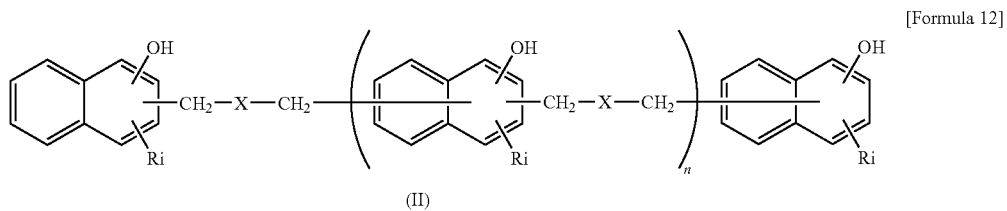

(II)

(wherein, each R represents a hydrogen atom, or a substituted or unsubstituted monovalent hydrocarbon group of 1 to 12 carbon atoms, which may be all the same, or may be different. i represents either 0 or an integer from 1 to 3, X represents a bivalent organic group that contains an aromatic ring, and n represents either 0 or an integer from 1 to 10.)

Examples of the group R within the above general formula (II) include chain-like alkyl groups such as a methyl group, ethyl group, propyl group, isopropyl group, n-butyl group, sec-butyl group, t-butyl group, pentyl group, hexyl group, octyl group, decyl group, or dodecyl group; cyclic alkyl groups such as a cyclopentyl group, cyclohexyl group, cycloheptyl group, cyclopentenyl group, or cyclohexenyl group; aryl group-substituted alkyl groups such as a benzyl group or phenethyl group; alkoxy group-substituted alkyl groups such as methoxy group-substituted alkyl groups, ethoxy group-substituted alkyl groups, or butoxy group-substituted alkyl groups; alkyl groups substituted with amino group such as a dimethylamino group or diethylamino group; hydroxyl group-substituted alkyl groups; unsubstituted aryl groups such as a phenyl group, naphthyl group, or biphenyl group; alkyl group-substituted aryl groups such as a tolyl group, dimethylphenyl group, ethylphenyl group, butylphenyl group, t-butylphenyl group, or dimethylnaphthyl group; alkoxy group-substituted aryl groups such as a methoxyphenyl group, ethoxyphenyl group, butoxyphenyl group, t-butoxyphenyl group, or methoxynaphthyl group; aryl groups substituted with amino group such as a dimethylamino group or diethylamino group; and hydroxyl group-substituted aryl groups. Of these, R is preferably a hydrogen atom or a methyl group.

The group X within the above general formula (II) represents an organic group that contains an aromatic ring, and suitable examples include arylene groups such as a phenylene group, biphenylene group, or naphthylene group; alkyl group-substituted arylene groups such as a tolylene group or xylylene group; alkoxyl group-substituted arylene groups; aralkyl groups such as a benzyl group or phenethyl group; and aralkyl group-substituted arylene groups.

Of these, from the viewpoints of storage stability and flame retardancy, X is preferably a substituted or unsubstituted phenylene group or biphenylene group, and even more preferably a phenylene group, so that, for example, the naphthol-aralkyl resins represented by general formulas (XIII) and (XIV) shown below are preferred.

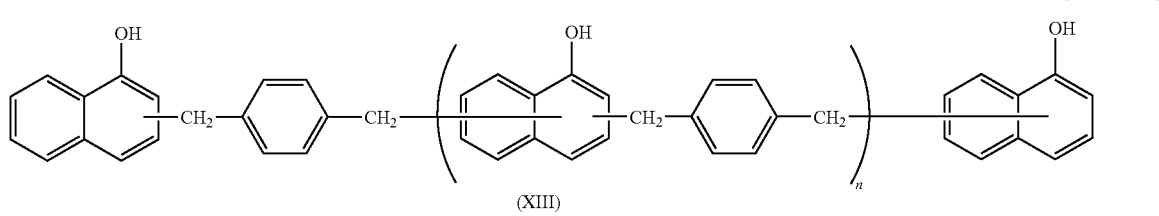

(XIII)

(wherein, n represents either 0 or an integer from 1 to 10.)

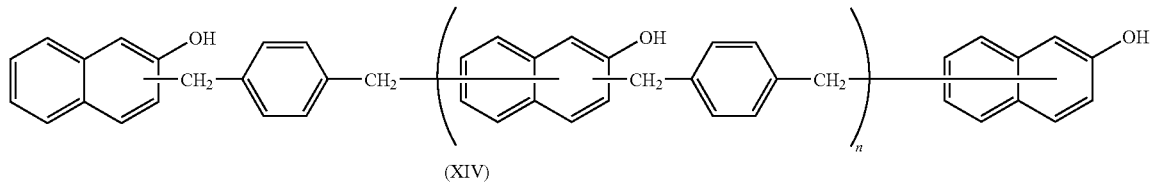

(XIV)

(wherein, n represents either 0 or an integer from 1 to 10.)

In the above general formulas (XIII) and (XIV), on average, n is preferably no greater than 6.

An example of a commercially available product of a naphthol-aralkyl resin represented by the above general formula (XIII) is the product "SN-475" manufactured by Nippon Steel Chemical Group. An example of a commercially available product of a naphthol-aralkyl resin represented by the above general formula (XIV) is the product "SN-170" manufactured by Nippon Steel Chemical Group.

In order to ensure adequate manifestation of the resin properties, the blend quantity of the above naphthol-aralkyl resin is preferably at least 20% by weight, even more preferably 30% by weight or greater, and most preferably 50% by weight or greater, relative to the total weight of the curing agent.

In the case of the phenol-aralkyl resins represented by the above general formula (I) and the naphthol-aralkyl resins represented by the above general formula (II), from the viewpoint of flame retardancy, either a portion of, or all of, the resin is preferably premixed with acenaphthylene. Acenaphthylene can be obtained by dehydrogenation of acenaphthene, although a commercial product may also be used.

Alternatively, a polymer of acenaphthylene, or a polymer of acenaphthylene and another aromatic olefin may be used instead of acenaphthylene. Examples of suitable methods of obtaining a polymer of acenaphthylene, or a polymer of acenaphthylene and another aromatic olefin include radical polymerization, cationic polymerization, and anionic polymerization. During this polymerization, a conventional catalyst can be used, but polymerization may also be conducted without a catalyst, simply by heating. In such cases, the polymerization temperature is preferably within a range from 80 to 160° C., and even more preferably from 90 to 150° C.

The softening point of the produced polymer of acenaphthylene or polymer of acenaphthylene and another aromatic olefin is preferably within a range from 60 to 150° C., and even more preferably from 70 to 130° C. If this softening point is lower than 60° C., then the moldability tends to deteriorate due to exudation during molding, whereas if the softening point is higher than 150° C., the compatibility with the resin tends to deteriorate.

Examples of the other aromatic olefin copolymerized with the acenaphthylene include styrene, α-methylstyrene, indene, benzothiophene, benzofuran, vinylnaphthalene, vinylbiphenyl, and alkyl-substituted derivatives of these olefins. These may be used either alone, or in combinations of two or more different compounds.

Moreover, besides the aromatic olefin described above, aliphatic olefins may also be used in combination, provided the effects of the present invention are not impaired. Examples of suitable aliphatic olefins include (meth)acrylic acid and esters thereof; as well as maleic anhydride, itaconic anhydride, fumaric acid, and esters thereof. The quantity used of these aliphatic olefins is preferably no more than 20% by weight, and even more preferably no more than 9% by weight, relative to the total weight of the polymerization monomers.

Examples of suitable methods of premixing either a portion of, or all of, the curing agent with acenaphthylene to produce a preliminary mixture (an acenaphthylene-modified curing agent) include methods in which the curing agent and the acenaphthylene are both ground finely, and then mixed together in a solid state using a mixer or the like; methods in which both components are dissolved uniformly in a suitable solvent, and the solvent is then removed; and methods in which the two components are subjected to melt mixing at a temperature at least as high as the softening point of the curing agent and/or the acenaphthylene.

Of these, melt mixing methods, which enable a uniform mixture to be obtained and suffer minimal impurity contamination, are preferred. There are no particular restrictions on the melt mixing temperature, provided it is at least as high as the softening point of the curing agent and/or the acenaphthylene, but temperatures within a range from 100 to 250° C. are preferred, and temperatures from 120 to 200° C. are even more desirable. There are no particular restrictions on the melt mixing time, provided the two components are mixed uniformly, but a time within a range from 1 to 20 hours is preferred, and times from 2 to 15 hours are even more desirable. In those cases where the curing agent and the acenaphthylene are premixed, no problems arise if the acenaphthylene undergoes either polymerization or reaction with the curing agent within the mixture.

In the molding material, from the viewpoint of improving the flame retardancy, the curing agent preferably comprises at least 50% by weight of the aforementioned preliminary mixture (the acenaphthylene-modified curing agent). From the viewpoint of flame retardancy, the quantity of acenaphthylene and/or the polymer of the other aromatic olefin that contains acenaphthylene incorporated within the acenaphthylene-modified curing agent is preferably at least 5% by weight, and from the viewpoint of moldability, is preferably no more than 40% by weight, and even more preferably from 8 to 25% by weight. From the viewpoints of flame retardancy and moldability, the quantity of acenaphthylene structures contained within the molding material is preferably within a range from 0.1 to 5% by weight, and even more preferably from 0.3 to 3% by weight.

Although there are no particular restrictions on the equivalence ratio between the epoxy resin and the curing agent, that is, the ratio of the number of hydroxyl groups within the curing agent relative to the number of epoxy groups within the epoxy resin (number of hydroxyl groups within the curing agent/number of epoxy groups within the epoxy resin), in order to limit the unreacted fraction of both components, the ratio is preferably set within a range from 0.5 to 2, and even more preferably from 0.6 to 1.3. In order to obtain a molding material with excellent moldability, the ratio is most preferably set within a range from 0.8 to 1.2.

The molding material preferably includes a curing accelerator. There are no particular restrictions on the curing accelerator used, provided the compound is typically used in epoxy resin molding materials for sealing, and suitable examples include cycloamidine compounds such as 1,8-diazabicyclo[5.4.0]undecene-7,1,5-diazabicyclo[4.3.0]nonene-5,5,6-dibutylamino-1,8-diazabicyclo[5.4.0]undecene-7, and derivatives thereof; compounds with intramolecular polarization produced by the addition of maleic anhydride, a quinone compound such as 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone or phenyl-1,4-benzoquinone, or a compound with a π-bond such as diazophenylmethane or a phenolic resin to an aforementioned cycloamidine compound; tertiary amines such as benzyldimethylamine, triethanolamine, dimethylaminoethanol, tris(dimethylaminomethyl)phenol, and derivatives thereof; imidazoles such as 2-methylimidazole, 2-phenylimidazole, 2-phenyl-4-methylimidazole, 2-heptadecylimidazole, and derivatives thereof; organophosphines, including trialkylphosphines such as tributylphosphine, dialkylarylphosphines such as dimethylphenylphosphine, alkyldiarylphosphines such as methyldiphenylphosphine, triphenylphosphine, tris(alkylphenyl)phosphines such as tris(4-methylphenyl)phosphine, as well as tris(alkoxyphenyl) phosphines, tris(alkyl-alkoxyphenyl)phosphines, tris(dialkylphenyl)phosphines, tris(trialkylphenyl)phosphines, tris(tetraalkylphenyl)phosphines, tris(dialkoxyphenyl)phosphines, tris(trialkoxyphenyl)phosphines, tris(tetraalkoxyphenyl)phosphines, diphenylphosphine, diphenyl(p-tolyl)phosphine, and derivatives thereof; phosphorus compounds with intramolecular polarization produced by the addition of a compound with a π-bond such as a quinone compound, maleic anhydride, diazophenylmethane or a phenolic resin to an aforementioned organophosphine compound; tetraphenylborates such as tetraphenylphosphonium tetraphenylborate, triphenylphosphine tetraphenylborate, 2-ethyl-4-methylimidazole tetraphenylborate, N-methylmorpholine tetraphenylborate, and derivatives thereof, and complexes of an organophosphine and an organoboron compound. These may be used either alone, or in combinations of two or more different materials.

Of these, from the viewpoints of fluidity and curability, an addition reaction product of a tertiary phosphine compound and a quinone compound is preferred, and an addition reaction product of triphenylphosphine and 1,4-benzoquinone, or an addition reaction product of tributylphosphine and 1,4-benzoquinone are even more desirable.

There are no particular restrictions on the blend quantity of the curing accelerator, provided the desired curing acceleration effect is achieved, but from the viewpoints of curability and fluidity, a quantity within a range from 0.2 to 10% by weight relative to the combined weight of the epoxy resin and the curing agent is preferred.

The molding material preferably includes an inorganic filler. The inorganic filler used is added to the molding material for the purposes of improving the moisture absorption properties, reducing the coefficient of linear expansion, improving the thermal conductivity, and improving the strength, and there are no particular restrictions on the inorganic filler, provided it is a filler typically used in epoxy resin molding materials for sealing.

Suitable examples include powders of materials such as fused silica, crystalline silica, alumina, zircon, calcium silicate, calcium carbonate, potassium titanate, silicon carbide, silicon nitride, aluminum nitride, boron nitride, beryllia, zirconia, zircon, forsterite, steatite, spinel, mullite and titania, as well as beads produced by converting any of these powders to spherical form, and glass fiber. These fillers may be used either alone, or in combinations of two or more different fillers.

Of these, fused silica is preferred in terms of reducing the coefficient of linear expansion, and alumina is preferred in terms of achieving a high thermal conductivity. In terms of achieving favorable fluidity and mold abrasion characteristics during molding, the shape of the filler is preferably spherical.

From the viewpoints of flame retardancy, moldability, moisture absorption, reducing the coefficient of linear expansion, and improving the strength, the blend quantity of the inorganic filler is preferably within a range from 70 to 95% by weight relative to the entire weight of the molding material, and from the viewpoints of moisture absorption and reducing the coefficient of linear expansion, is even more preferably within a range from 85 to 95% by weight. If this quantity is less than 70% by weight, then the flame retardancy and reflow resistance tend to deteriorate, whereas if the quantity exceeds 95% by weight, the fluidity tends to become unsatisfactory.

From the viewpoint of improving the moisture resistance and high temperature storage properties of semiconductor elements such as ICs, an ion trapping agent is preferably also added to the molding material if required. There are no particular restrictions on this ion trapping agent, and conventional materials can be used, including hydrotalcites, and hydrous oxides of elements selected from amongst magnesium, aluminum, titanium, zirconium, and bismuth. Any of these materials may be used alone, or in combinations of two or more different materials.

Of these, hydrotalcites represented by a compositional formula (XV) shown below are preferred.

[Formula 15]

$$Mg_{1-X}Al_X(OH)_2(CO_3)_{X/2} \cdot mH_2) \tag{XV}$$

(wherein, $0 < X \leq 0.5$, and m is a positive number)

There are no particular restrictions on the blend quantity of the ion trapping agent, which need only be sufficient to capture any anions such as halide ions, but from the viewpoints of fluidity and flexural strength, the blend quantity is preferably within a range from 0.1 to 30% by weight, even more preferably from 0.5 to 10% by weight, and most preferably from 1 to 5% by weight, relative to the epoxy resin.

In order to enhance the adhesion between the resin component and the inorganic filler, conventional coupling agents are preferably added to the molding material if required, including the various silane-based compounds such as epoxysilanes, mercaptosilanes, aminosilanes, alkylsilanes, ureidosilanes, and vinylsilanes; as well as titanium-based compounds, aluminum chelates, and aluminum/zirconium-based compounds.

Specific examples include silane-based coupling agents such as vinyltrichlorosilane, vinyltriethoxysilane, vinyltris(β-methoxyethoxy)silane, γ-methacryloxypropyltrimethoxysilane, γ-methacryloxypropyltriethoxysilane, γ-acryloxypropyltrimethoxysilane, β-(3,4-epoxycyclohexyl)ethyltrimethoxysilane, γ-glycidoxypropyltrimethoxysilane, γ-glycidoxypropylmethyldimethoxysilane, vinyltriacetoxysilane, γ-mercaptopropyltrimethoxysilane, γ-aminopropyltriethoxysilane, γ-anilinopropyltrimethoxysilane, γ-anilinopropylmethyldimethoxysilane, γ-[bis(β-hydroxyethyl)]aminopropyltriethoxysilane, N-β-(aminoethyl)-γ-aminopropyltrimethoxysilane, γ-(β-aminoethyl)aminopropyldimethoxymethylsilane, N-(trimethoxysilylpropyl)ethylenediamine, N-(dimethoxymethylsilylisopropyl)ethylenediamine, methyltrimethoxysilane, dimethyldimethoxysilane, methyltriethoxysilane, N-β-(N-vinylbenzylaminoethyl)-γ-aminopropyltrimethoxysilane, γ-chloropropyltrimethoxysilane, hexamethyldisilane, vinyltrimethoxysilane, and γ-mercaptopropylmethyldimethoxysilane; and titanate-based coupling agents such as isopropyltriisostearoyl titanate, isopropyltris(dioctyl pyrophosphate) titanate, isopropyltri(N-aminoethylaminoethyl)titanate, tetraoctylbis(ditridecyl phosphite) titanate, tetra(2,2-diallyloxymethyl-1-butyl)bis(ditridecyl) phosphite titanate, bis(dioctyl pyrophosphate) oxyacetate titanate, bis(dioctyl pyrophosphate) ethylene titanate, isopropyltrioctanoyl titanate, isopropyldimethacrylisostearoyl titanate, isopropyltridodecylbenzenesulfonyl titanate, isopropylisostearoyldiacryl titanate, isopropyltri(dioctyl phosphate) titanate, isopropyltricumylphenyl titanate, and tetraisopropylbis(dioctyl phosphite) titanate. These coupling agents may be used either alone, or in combinations of two or more different compounds.

The blend quantity of the above coupling agent is preferably within a range from 0.05 to 5% by weight, and even more preferably from 0.1 to 2.5% by weight, relative to the inorganic filler. If this quantity is less than 0.05% by weight, then the adhesion to various package structural members tends to deteriorate, whereas if the quantity exceeds 5% by weight, molding defects such as voids tend to appear.

A flame retardant is also preferably added to the molding material if required. Although conventional brominated epoxy resins or antimony trioxide can be used as the flame retardant, the use of conventional halogen-free, antimony-free flame retardants is preferred.

Specific examples include red phosphorus, red phosphorus that is coated with a thermosetting resin or the like such as a phenolic resin, phosphorus compounds such as phosphate esters and triphenylphosphine oxide; nitrogen-containing compounds such as melamine, melamine derivatives, melamine-modified phenolic resins, compounds having a triazine ring, cyanuric acid derivatives, and isocyanuric acid derivatives; phosphorus- and nitrogen-containing compounds such as cyclophosphazenes; metal complex compounds such as dicyclopentadienyl iron; zinc compounds such as zinc oxide, zinc stannate, zinc borate, and zinc molybdate; metal oxides such as iron oxide and molybdenum oxide; metal hydroxides such as aluminum hydroxide and magnesium hydroxide; and composite metal hydroxides represented by a compositional formula (XVI) shown below. These flame retardants may be used either alone, or in combinations of two or more different compounds.

[Formula 16]

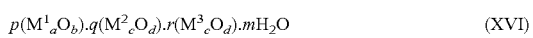

$$p(M^1{}_aO_b) \cdot q(M^2{}_cO_d) \cdot r(M^3{}_cO_d) \cdot mH_2O \qquad (XVI)$$

(wherein, $M^1$, $M^2$, and $M^3$ each represent a different metal element, a, b, c, d, p, q, and m represent positive numbers, and r represents either 0 or a positive number.)

There are no particular restrictions on $M^1$, $M^2$, and $M^3$ within the above compositional formula (XVI), provided they each represent a different metal element, but from the viewpoint of flame retardancy, $M^1$ is preferably selected from amongst metal elements of the third period, alkaline earth metal elements of group IIA, and metal elements belonging to group IVB, group IIB, group VIII, group IB, group IIIA, and group IVA, and $M^2$ is preferably selected from amongst the transition metal elements of groups IIIB to IIB. Moreover, $M^1$ is even more preferably selected from the group consisting of magnesium, calcium, aluminum, tin, titanium, iron, cobalt, nickel, copper, and zinc, and $M^2$ is even more preferably selected from the group consisting of iron, cobalt, nickel, copper, and zinc. From the viewpoint of fluidity, compounds in which $M^1$ is magnesium, $M^2$ is either zinc or nickel, and r=0 are preferred. Although there are no particular restrictions on the molar ratio between p, q, and r, compounds in which r=0, and p/q is within a range from 1/99 to 1/1 are preferred.

Classification of the metal elements was conducted on the basis of the extended period version of the periodic table that treats representative elements as a subgroup A, and transition metals as a subgroup B (reference: "Chemical Dictionary 4" published by Kyoritsu Shuppan Co., Ltd., compact edition, 30th printing, 15 Feb., 1987).

The flame retardants described above may be used either alone, or in combinations of two or more different compounds.

Of these, from the viewpoints of being halogen-free and antimony-free, and also exhibiting favorable stability and hydrolysis resistance, cyclic phosphazene compounds are preferred. Examples of cyclic phosphazene compounds include those compounds represented by a general formula (XVII) shown below.

[Formula 17]

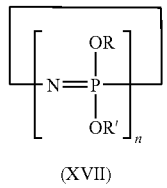

(XVII)

(wherein, n represents an integer from 3 to 5, and R and R' each represent an alkyl group of 1 to 4 carbon atoms or an aryl group, which may be either the same or different.)

Examples of the compounds represented by the above general formula (XVII) include trimer (n=3) 6-membered rings, tetramer (n=4) 8-membered rings, and pentamer (n=5) 10-membered rings, and these may be used either alone, or in combinations of two or more different compounds. Of these, from the viewpoint of fluidity, the use of a trimer phosphazene compound as the principal component is preferred.

The n groups R and R' within the above general formula (XVII) represent either an alkyl group of 1 to 4 carbon atoms or an aryl group, and the two groups may be either the same or different. For example, in the case of a trimer 6-membered ring phosphazene compound where n represents 3, the combined total of R and R' (the number of substituents) is 6, and these groups may be all the same, or may be different. From the viewpoints of heat resistance, moisture resistance, and moldability, at least one of R and R' is preferably an aryl group, and is even more preferably a phenyl group, and most preferably a hydroxyphenyl group.

In those cases where a hydroxyphenyl group is introduced, the number of hydroxyphenyl groups introduced is preferably within a range from 1 to 10, even more preferably from 1 to 4, and most preferably from 1 to 3. If the number of hydroxyphenyl groups is less than 1, then components that are unable to be incorporated within the cross-linked structure of the cured product of the epoxy resin appear, meaning the moldability and heat resistance are prone to deterioration, whereas if the number of hydroxyphenyl groups exceeds 10, then a tendency for the cured product to become brittle is observed.

In the hydroxyphenyl group, other optional substituents such as alkyl groups, alkoxy groups, aryl groups, amino groups, epoxy groups, vinyl groups, hydroxyalkyl groups, and alkylamino groups may also exist on the phenyl ring in addition to the hydroxy group.

Examples of preferred structures for the cyclic phosphazene compound include the trimers represented by the general formula (XVIII) shown below.

[Formula 18]

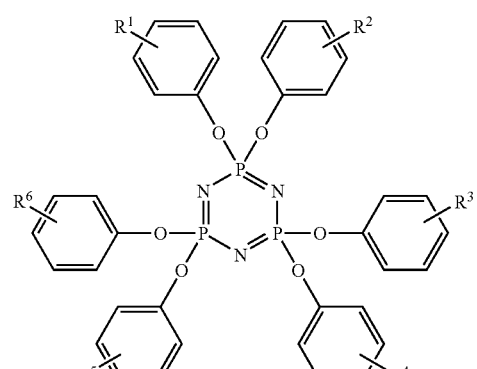

(XVIII)

(wherein, $R^1$ to $R^6$ may be the same or different, and each represent a hydroxyl group or a hydrogen atom, the number of hydroxyl groups is from 0 to 6, and the number of hydrogen atoms is from 6 to 0.)

In addition, the cyclic phosphazene compound may also include compounds formed by the cross-linking of cyclic phosphazene compounds (namely, (co)polymers). Examples of these cyclic phosphazenes having a cross-linked structure include cyclic phosphazene compounds comprising repeating units represented by the following formula (XIX) and/or formula (XX) within the principal chain skeleton, or cyclic phosphazene compounds comprising repeating units represented by the following formula (XXI) and/or formula (XXII), wherein the substitution position of substituents relative to the phosphorus atoms within the phosphazene ring are different, within the principal chain skeleton.

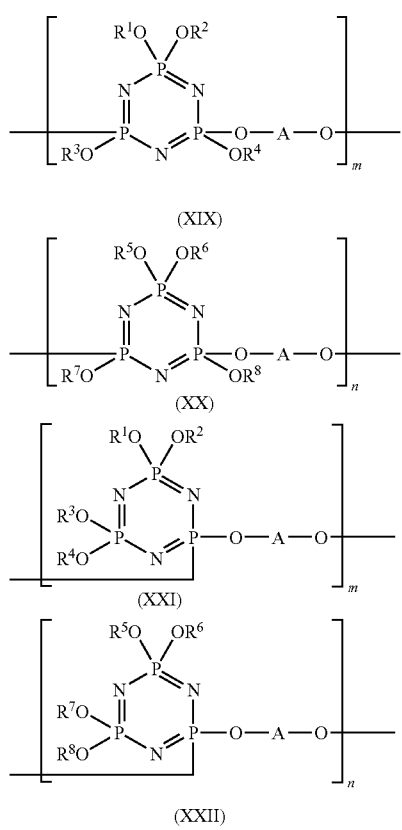

In the formula (XIX) and the formula (XXI), m represents an integer from 1 to 10, $R^1$ to $R^4$ represent alkyl groups of 1 to 12 carbon atoms which may contain substituents, or aryl groups which may contain substituents, and these groups may be all the same, or may be different. A represents either an alkylene group of 1 to 4 carbon atoms which may contain a substituent, or an arylene group which may contain a substituent.

In the formula (XX) and the formula (XXII), n represents an integer from 1 to 10, $R^5$ to $R^8$ represent alkyl groups of 1 to 12 carbon atoms which may contain substituents, or aryl groups which may contain substituents, and these groups may be all the same, or may be different. A represents an alkylene group of 1 to 4 carbon atoms, or an arylene group.

Moreover, in each of the formulas, the m groups $R^1$, $R^2$, $R^3$, and $R^4$ may be all the same, or may also be different, and the n groups $R^5$, $R^6$, $R^7$, and $R^8$ may be all the same, or may also be different.

In the formulas (XIX) through (XXII), there are no particular restrictions on the alkyl groups of 1 to 12 carbon atoms that may contain substituents represented by $R^1$ through $R^8$, and suitable examples include a methyl group, ethyl group, propyl group, isopropyl group, butyl group, isobutyl group, sec-butyl group, or tert-butyl group. Examples of the aryl groups that may contain substituents include aryl groups such as a phenyl group, 1-naphthyl group, or 2-naphthyl group; alkyl group-substituted aryl groups such as a o-tolyl group, m-tolyl group, p-tolyl group, 2,3-xylyl group, 2,4-xylyl group, o-cumenyl group, m-cumenyl group, p-cumenyl group, or mesityl group; and aryl group-substituted alkyl groups such as a benzyl group or phenethyl group. Examples of other substituents with which these alkyl groups or aryl groups may further be substituted include alkyl groups, alkoxyl groups, aryl groups, hydroxyl groups, amino groups, epoxy groups, vinyl groups, hydroxyalkyl groups, and alkylamino groups.

Of these, from the viewpoints of achieving favorable heat resistance and moisture resistance for the epoxy resin molding material, at least one of $R^1$ through $R^8$ is preferably an aryl group, and is even more preferably a phenyl group or hydroxyphenyl group.

There are no particular restrictions on the alkylene group of 1 to 4 carbon atoms represented by A in the above formulas (XIX) through (XXII), and suitable examples include a methylene group, ethylene group, propylene group, isopropylene group, butylene group, or isobutylene group, whereas examples of suitable arylene groups include a phenylene group, tolylene group, xylylene group, naphthylene group, or biphenylene group. These alkylene and arylene groups may also be substituted with alkyl groups, alkoxyl groups, aryl groups, hydroxyl groups, amino groups, epoxy groups, vinyl groups, hydroxyalkyl groups, and alkylamino groups and the like.

Of these, from the viewpoints of achieving favorable heat resistance and moisture resistance for the epoxy resin molding material, A is preferably an arylene group, and is even more preferably a phenylene group or biphenylene group.

In those cases where the cyclic phosphazene compound is a (co)polymer with a cross-linked structure, preferred examples include homopolymers formed from compounds of each of the above formulas (XIX) through (XXII), copolymers of a compound of the formula (XIX) and a compound of the formula (XX), and copolymers of a compound of the formula (XXI) and a compound of the formula (XXII). In the case of a copolymer, any one of a random copolymer, block copolymer, or alternating copolymer is suitable. There are no particular restrictions on the copolymerization molar ratio m/n, but from the viewpoints of improving the heat resistance and strength of the epoxy resin cured product, a ratio within a range from 1/0 to 1/4 is preferred, and a ratio from 1/0 to 1/1.5 is even more desirable. The polymerization degree m+n is preferably within a range from 1 to 20, even more preferably from 2 to 8, and most preferably from 3 to 6.

More specific examples of suitable examples of cyclic phosphazene compound polymers include the polymers represented by the following formula (XXIII), and the copolymers represented by the following formula (XXIV).

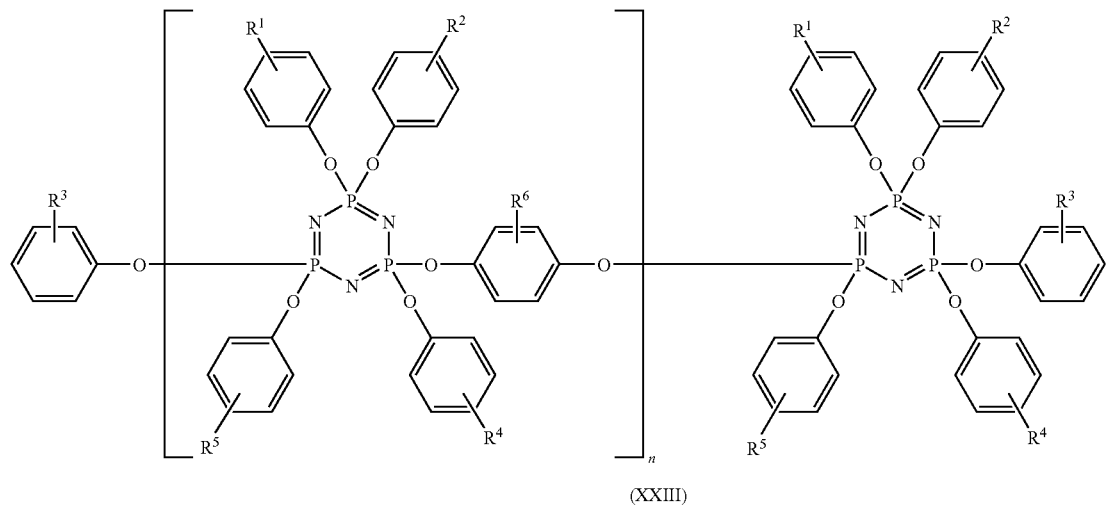
(wherein, n within the formula represents an integer from 0 to 9, and $R^1$ to $R^6$ each represent, independently, a hydrogen atom or a hydroxyl group.)
(wherein, m and n within the formula each represent, independently, an integer from 0 to 9, and $R^1$ to $R^6$ each represent, independently, a hydrogen atom or a hydroxyl group.)
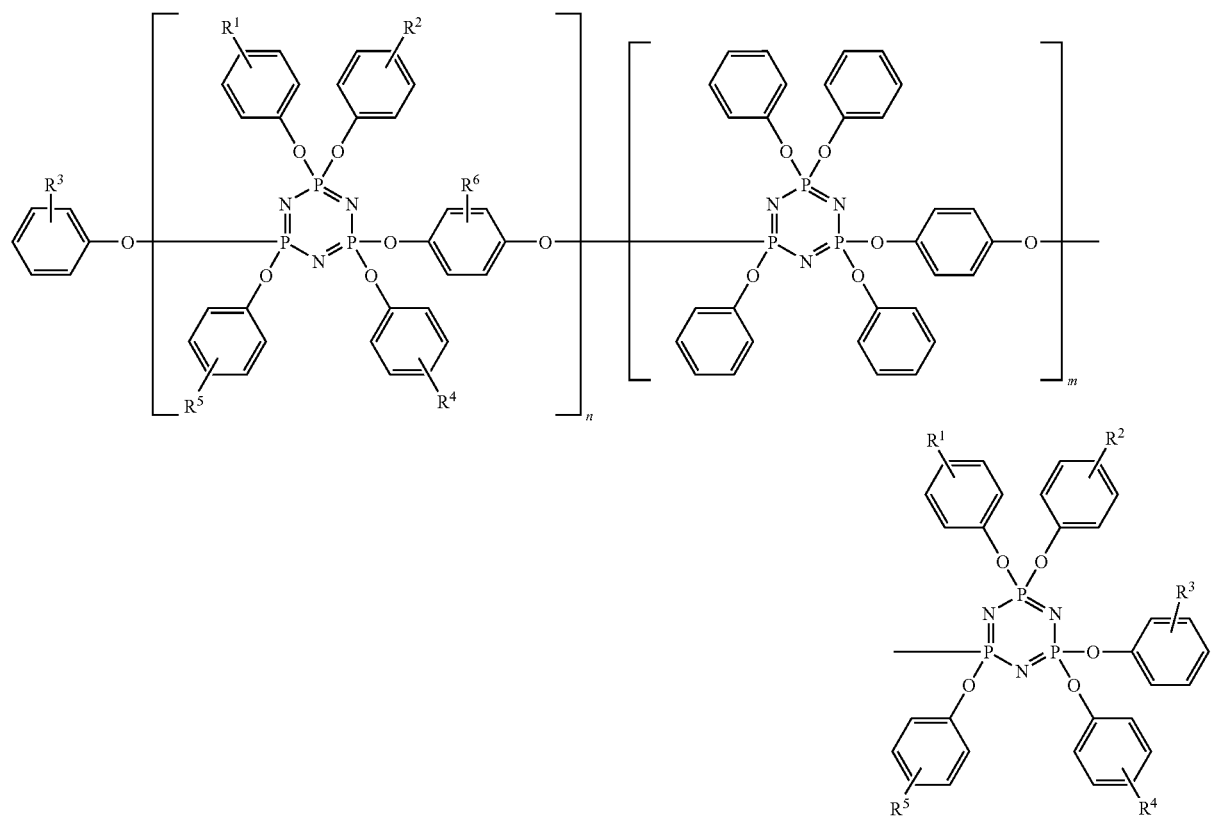

A cyclic phosphazene compound represented by the above formula (XXIV) contains m repeating units (a) shown below and n repeating units (b) shown below, which may be arranged alternately, in a block arrangement, or randomly, although a random arrangement is preferred.

[Formula 22]

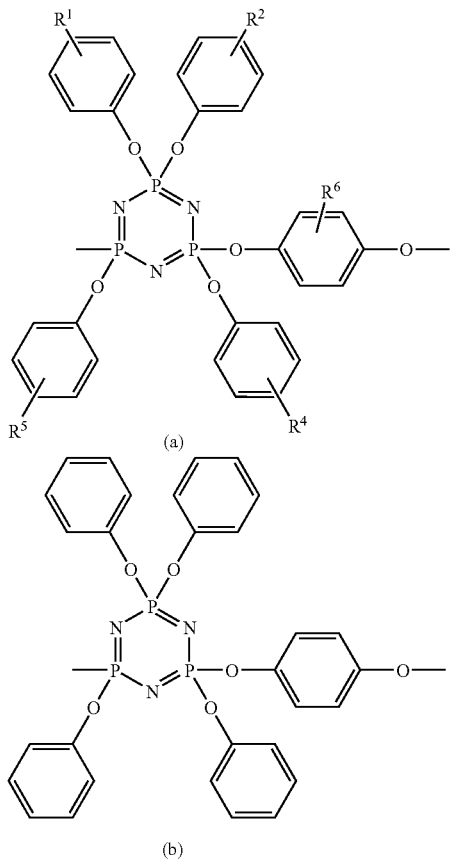

Of the examples presented above, those containing a polymer of the above formula (XXIII) in which n is from 3 to 6 as the primary component, or those containing, as the primary component, a copolymer of the above formula (XXIV) in which $R^1$ to $R^6$ are either all hydrogen atoms or one of these groups is a hydroxyl group, n/m is within a range from 1/2 to 1/3, and n+m is within a range from 3 to 6, are preferred.

Examples of commercially available phosphazene compounds include SPE-100 (a product name, manufactured by Otsuka Chemical Co., Ltd.) and SPH-100 (a product name, manufactured by Otsuka Chemical Co., Ltd.).

The blend quantity of the cyclic phosphazene compound within the molding material, reported as a quantity of phosphorus atoms relative to the combined weight of all the other components excluding the filler, is preferably at least 0.2% by weight of phosphors atoms from the viewpoint of the resulting flame retardancy effect, and is preferably no more than 5.0% by weight from the viewpoint of the moisture resistance.

In addition, other additives including release agents such as higher fatty acids, metal salts of higher fatty acids, ester-based waxes, amide-based waxes, polyolefin-based waxes, polyethylene, and polyethylene oxide; and stress relaxation agents such as silicone oils, silicone resins, liquid rubbers, rubber powders, and thermoplastic resins are also preferably added to the molding material as required.

The molding material can be prepared by any method that enables the various raw materials to be dispersed and mixed together uniformly, and typical methods include those in which predetermined blend quantities of the raw materials are mixed together thoroughly using a mixer or the like and subsequently subjected to melt mixing using mixing rollers or an extruder or the like, and the mixture is then cooled and ground. Converting the product to tablets of dimensions and weight that are appropriate for the molding conditions facilitates use of the product.

Examples of electronic components of the present invention, which comprise an element that is sealed with an aforementioned epoxy resin molding material for sealing according to the present invention, include components in which elements including active elements such as a semiconductor chip, transistor, diode, or thyristor, and/or passive elements such as a capacitor, resistor, or coil have been mounted on a support member such as a lead frame, wired tape carrier, wiring board, glass, or silicon wafer, and the necessary portions of the component have then been sealed with the molding material according to the present invention.

Specific examples of these types of electronic components include typical resin-sealed ICs such as DIP (Dual Inline Package), PLCC (Plastic Leaded Chip Carrier), QFP (Quad Flat package), SOP (Small Outline Package), SOJ (Small Outline J-lead Package), TSOP (Thin Small Outline Package), and TQFP (Thin Quad Flat Package) in which semiconductor components are secured to a lead frame, element terminals such as bonding pads and leads are connected by wire bonding or through bumps, and the component is then sealed by transfer molding or the like using an aforementioned molding material; TCPs (Tape Carrier Packages) in which a semiconductor chip bonded to a tape carrier through bumps is sealed with an aforementioned molding material; COB (Chip On Board) modules in which active elements such as a semiconductor chip, transistor, diode, or thyristor, and/or passive elements such as a capacitor, resistor, or coil which have been connected to wiring formed on a wiring board or glass sheet, by wire bonding, flip-chip bonding or soldering or the like, are sealed with an aforementioned molding material; hybrid ICs; multichip modules; BGAs (Ball Grid Arrays) in which a semiconductor chip is mounted on an interposer board on which are formed terminals for connection to a mother board, bumps or wire bonding are used to connect the semiconductor chip to wiring formed on the interposer board, and the side of the structure on which the semiconductor has been mounted is then sealed with an aforementioned molding material; and single side sealed packages such as CSP (Chip Size Package) and MCP (Multi Chip Package).

Of these, because the molding material according to the present invention contains no conductive materials that can cause shorting defects, it is ideally suited to electronic components such as fine pitch semiconductor devices in which the distance between inner leads, pads, or wiring is very narrow. Moreover, this molding material can also be used for forming a composition with excellent moldability properties such as fluidity and curability.

In terms of the method of sealing an element using the molding material according to the present invention, although low pressure transfer molding is the most commonly used method, injection molding and compression molding and the like may also be used.

EXAMPLES

As follows is a description of the present invention based on a series of examples, but the present invention is in no way limited to these examples.

Examples 1 to 19, Comparative Examples 1 to 9

The components listed below were blended together using the parts by weight quantities shown in Table 1 through Table 3, and roll kneading was then conducted under conditions including a kneading temperature of 80° C. and a kneading time of 10 minutes, thereby yielding epoxy resin molding materials for sealing according to each of the examples and comparative examples.

<Colorant>
Mesophase microspheres with an average particle size of 3 μm, a carbon content of 92.5%, and an electrical resistivity of $1.7 \times 10^7$ Ω·cm (product name: "MCMB Green" manufactured by Osaka Gas Chemicals Co., Ltd.); black titanium oxide with an average particle size of 70 nm and an electrical resistivity of $4.1 \times 10^6$ Ω·cm (product name: titanium black, manufactured by Jemco Inc.); and carbon black with an average particle size of 22 nm, a carbon content of 97.4%, and an electrical resistivity of $1.5 \times 10^{-1}$ Ω·cm (product name: MA-100, manufactured by Mitsubishi Chemical Corporation) were used.

The average particle size was determined using a laser diffraction/scattering-type particle size distribution analyzer (LA-700, manufactured by Horiba, Ltd.).

The carbon content was determined using an organic elemental analyzer (EA-1108 manufactured by Carlo Erba).

The electrical resistivity was determined in accordance with the "method of measuring electrical resistivity of acetylene black" detailed in JIS K1469. In other words, a 3 g sample was placed inside a hollow, insulating, circular cylindrical vessel, between brass electrodes with a cross-sectional surface area of 4.9 cm², the sample thickness (cm) was measured under an applied pressure of 4.9 MPa, and the electrodes were then connected to a resistance meter (TR8601 manufactured by Advantest Corporation), and the resistance value (Ω) at a DC voltage of 100 V was measured. The electrical resistivity (Ω·cm) was calculated from the formula: cross-sectional surface area (4.9 cm²)×resistance value (Ω)/sample thickness (cm).

<Epoxy Resin>
A biphenyl type epoxy resin with an epoxy equivalence of 187 and a melting point of 109° C. (epoxy resin 1: product name: Epikote YX-4000, manufactured by Japan Epoxy Resins Co., Ltd.); a bisphenol F type epoxy resin with an epoxy equivalence of 188 and a melting point of 75° C. (epoxy resin 2: product name: YSLV-80XY, manufactured by Nippon Steel Chemical Group); a phenol-aralkyl type epoxy resin/4,4'-bis(2,3-epoxypropoxy)biphenyl mixture (mixture weight ratio: 8/2) with an epoxy equivalence of 241 and a softening point of 95° C. (epoxy resin 3: product name: CER-3000L, manufactured by Nippon Kayaku Co., Ltd.); a β-naphthol-aralkyl type epoxy resin with an epoxy equivalence of 265 and a softening point of 66° C. (epoxy resin 4: product name: ESN-175S, manufactured by Nippon Steel Chemical Group); a sulfur atom-containing epoxy resin with an epoxy equivalence of 242 and a melting point of 110° C. (epoxy resin 5: product name: YSLV-120TE, manufactured by Nippon Steel Chemical Group); and a brominated bisphenol A type epoxy resin with a bromine content of 49% by weight, an epoxy equivalence of 397, and a softening point of 69° C. (epoxy resin 6: product name: Epotohto YDB-400, manufactured by Tohto Kasei Co., Ltd.) were used.

<Curing Agent>
A phenol-aralkyl resin with a hydroxyl group equivalence of 176 and a softening point of 70° C. (curing agent 1: product name: Milex XLC, manufactured by Mitsui Chemicals, Inc.); an acenaphthylene-containing β-naphthol-aralkyl resin with a hydroxyl group equivalence of 209 and a softening point of 81° C. (curing agent 2: product name: SN-170-AR10, manufactured by Nippon Steel Chemical Group); a phenol-aralkyl resin with a hydroxyl group equivalence of 200 and a softening point of 80° C. (curing agent 3: product name: MEH-7851, manufactured by Meiwa Plastic Industries, Ltd.); a phenolic resin with a hydroxyl group equivalence of 103 and a softening point of 86° C. (curing agent 4: product name: MEH-7500, manufactured by Meiwa Plastic Industries, Ltd.); and a phenolic resin with a hydroxyl group equivalence of 156 and a softening point of 83° C. (curing agent 5: product name: HE-510, manufactured by Sumikin Air Water Chemical Inc.) were used.

<Curing Accelerator>
An addition reaction product of triphenylphosphine and 1,4-benzoquinone (curing accelerator 1), and an addition reaction product of tributylphosphine and 1,4-benzoquinone (curing accelerator 2) were used.

<Flame Retardant>
A phenoxy type cyclic phosphazene compound containing no hydroxyphenyl groups and with a melting point of 105° C. (SPE-100, manufactured by Otsuka Chemical Co., Ltd.) (cyclic phosphazene compound 1), and a hydroxyphenyl group-containing phenoxy type cyclic phosphazene compound with a hydroxyl group equivalence of 242 (SPH-100, manufactured by Otsuka Chemical Co., Ltd.) (cyclic phosphazene compound 2) were used.

<Other>
Spherical fused silica with an average particle size of 17.5 μm and a specific surface area of 3.8 m²/g was used as an inorganic filler, and γ-glycidoxypropyltrimethoxysilane (product name: A-187, manufactured by Nippon Unicar Co., Ltd.) was used as a coupling agent. Carnauba wax (manufactured by Clariant Ltd.) was used as another additive.

TABLE 1

| | | | | | | | | | (Units: parts by weight) |
| | | | | | Example | | | | |
| Item | 1 | 2 | 3 | 4 | 5 | 6 | 7 | 8 | 9 |
|---|---|---|---|---|---|---|---|---|---|
| Mesophase microspheres | 1.8 | 5.0 | 4.5 | 18 | 5.0 | 5.0 | 5.0 | 5.0 | 5.0 |
| Black titanium oxide | | | 3.0 | | | | | | |
| Epoxy resin 1 | 100 | 100 | 100 | 100 | | | | | |
| Epoxy resin 2 | | | | | 100 | 100 | 100 | | |
| Epoxy resin 3 | | | | | | | | 100 | 100 |

TABLE 1-continued (Units: parts by weight)

| Item | Example 1 | 2 | 3 | 4 | 5 | 6 | 7 | 8 | 9 |
|---|---|---|---|---|---|---|---|---|---|
| Curing agent 1 | 94 | 94 | 94 | 94 | | | | 73 | |
| Curing agent 2 | | | | | | | | | 87 |
| Curing agent 3 | | | | | 106 | 43 | | | |
| Curing agent 4 | | | | | | 33 | | | |
| Curing agent 5 | | | | | | | 83 | | |
| Curing accelerator 1 | 3.0 | 3.0 | 3.0 | 3.0 | | | | 2.5 | 3.0 |
| Curing accelerator 2 | | | | | 7.0 | 4.5 | 5.0 | | |
| Carnauba wax | 1.0 | 1.0 | 1.0 | 1.0 | 1.0 | 1.0 | 1.0 | 1.0 | 1.0 |
| Coupling agent | 10 | 10 | 10 | 10 | 10 | 10 | 10 | 10 | 10 |
| Fused silica | 1798 | 1826 | 1847 | 1937 | 2106 | 1799 | 1873 | 1441 | 1547 |

TABLE 2

(Units: parts by weight)

| Item | Example 10 | 11 | 12 | 13 | 14 | 15 | 16 | 17 | 18 | 19 |
|---|---|---|---|---|---|---|---|---|---|---|
| Mesophase microspheres | 5.0 | 5.0 | 5.0 | 5.0 | 3.0 | 10 | 6.0 | 5.0 | 1.8 | 1.8 |
| Black titanium oxide | | | | | | | 3.0 | | | |
| Epoxy resin 1 | | | | 85 | 100 | 100 | | 60 | 100 | 100 |
| Epoxy resin 2 | | | | | | | 100 | | | |
| Epoxy resin 3 | | | | | | | | 40 | | |
| Epoxy resin 4 | 100 | 100 | | | | | | | | |
| Epoxy resin 5 | | | 100 | | | | | | | |
| Epoxy resin 6 | | | | 15 | | | | | | |
| Curing agent 1 | 66 | | 73 | 87 | 94 | 94 | | 43 | 94 | 87 |
| Curing agent 2 | | 79 | | | | | | | | |
| Curing agent 3 | | | | | | | 106 | 49 | | |
| Curing accelerator 1 | 2.8 | 3.0 | 3.0 | 3.0 | 3.0 | 3.0 | | 3.0 | 3.0 | 3.0 |
| Curing accelerator 2 | | | | | | | 7.0 | | | |
| Carnauba wax | 1.0 | 1.0 | 1.0 | 1.0 | 1.0 | 1.0 | 1.0 | 1.0 | 1.0 | 1.0 |
| Antimony trioxide | | | | 5.0 | | | | | | |
| Cyclic phosphazene compound 1 | | | | | | | | | 10 | |
| Cyclic phosphazene compound 2 | | | | | | | | | | 10 |
| Coupling agent | 10 | 10 | 10 | 10 | 10 | 10 | 10 | 10 | 10 | 10 |
| Fused silica | 1393 | 1488 | 1442 | 1584 | 1808 | 1868 | 2143 | 1583 | 1884 | 1822 |

TABLE 3

(Units: parts by weight)

| Item | Comparative Example 1 | 2 | 3 | 4 | 5 | 6 | 7 | 8 | 9 |
|---|---|---|---|---|---|---|---|---|---|
| Black titanium oxide | | | | | | | | 5.0 | |
| Carbon black | 3.5 | 3.5 | 3.5 | 3.5 | 3.5 | 3.5 | 3.5 | | 3.5 |
| Epoxy resin 1 | 100 | | | | | | | 100 | 60 |
| Epoxy resin 2 | | 100 | 100 | | | | | | |
| Epoxy resin 3 | | | | 100 | 100 | | | | 40 |
| Epoxy resin 4 | | | | | | 100 | 100 | | |
| Curing agent 1 | 94 | | | 73 | | 66 | | 94 | 43 |
| Curing agent 2 | | | | | 87 | | 79 | | |
| Curing agent 3 | | 106 | 43 | | | | | | 49 |
| Curing agent 4 | | | 33 | | | | | | |
| Curing accelerator 1 | 3.0 | | | 2.5 | 3.0 | 2.8 | 3.0 | 3.0 | 3.0 |
| Curing accelerator 2 | | 7.0 | 4.5 | | | | | | |
| Carnauba wax | 1.0 | 1.0 | 1.0 | 1.0 | 1.0 | 1.0 | 1.0 | 1.0 | 1.0 |
| Coupling agent | 10 | 10 | 10 | 10 | 10 | 10 | 10 | 10 | 10 |
| Fused silica | 1813 | 2092 | 1785 | 1429 | 1536 | 1382 | 1477 | 1826 | 1572 |

Each of the molding materials produced in the examples and comparative examples was evaluated using each of the following tests. The results are shown in Table 4 through Table 6. Molding of the molding materials was conducted using a transfer molding device, under conditions including a mold temperature of 180° C., a molding pressure of 6.9 MPa, and a curing time of 90 seconds. Post-curing was then conducted at 180° C. for 5 hours.

(1) Fluidity

Using a mold for measuring spiral flow in accordance with EMMI-1-66, each molding material was molded under the conditions described above, and the flow distance (cm) was determined.

(2) Hot Hardness

Each molding material was molded into a circular disc of diameter 50 mm×thickness 3 mm under the conditions described above, and immediately following molding, a Shore D hardness meter was used to measure the hot hardness.

(3) Storage Stability

Each molding material was stored for 48 hours under conditions of 25° C./50% RH, the spiral flow was then measured in the same manner as (1) above, and the storage stability was determined from the level of retention of the flow distance before and after the storage.

(4) Flame Retardancy

Using a mold capable of molding a test specimen of thickness 0.16 mm, each molding material was molded and post-cured under the conditions described above, and combustion tests were then conducted in accordance with UL-94, with the flame retardancy being evaluated as the combined afterflame time calculated by combining the afterflame times for five test specimens.

(5) Reflow Resistance

Using each molding material, an 80-pin flat package with external dimensions of 20 mm×14 mm×2 mm on which had been mounted a silicon chip of dimensions 8 mm×10 mm×0.4 mm was fabricated on a copper lead frame by conducting molding and post-curing under the conditions described above, and following humidification at 85° C. and 85% RH for 168 hours, a reflow treatment was conducted at 245° C. for 10 seconds, and the package was then inspected for the presence of cracking. The reflow resistance was evaluated as the number of cracked packages relative to the number of packages tested (10).

(6) Coloring Properties

Each molding material was molded into a circular disc of diameter 50 mm×thickness 3 mm under the conditions described above, and using a spectrophotometric colorimeter SE-2000 (manufactured by Nippon Denshoku Industries Co., Ltd.), the value of L*a*b* was determined for a C light source and a view angle of 2 degrees using a reflection method, and this value was used as an indicator of the degree of blackness.

(7) Electrical Properties

Using each molding material, a 176-pin flat package with external dimensions of 20 mm×20 mm×1.4 mm on which had been mounted a silicon chip of dimensions 8 mm×8 mm×0.4 mm was fabricated on a copper lead frame under the conditions described above. The electrical properties were evaluated as the number of packages for which shorting defects developed relative to the total number of packages tested (1,000).

TABLE 4

| | Example | | | | | | | | |
|---|---|---|---|---|---|---|---|---|---|
| Item | 1 | 2 | 3 | 4 | 5 | 6 | 7 | 8 | 9 |
| Fluidity (cm) | 120 | 121 | 121 | 118 | 116 | 135 | 130 | 122 | 117 |
| Hot hardness | 82 | 82 | 83 | 80 | 84 | 85 | 84 | 83 | 81 |
| Storage stability (%) | 91 | 91 | 90 | 91 | 90 | 93 | 93 | 93 | 95 |
| Combined afterflame time (s) | 40 | 38 | 36 | 39 | 28 | 33 | 37 | 40 | 30 |
| Reflow resistance | 0/10 | 0/10 | 0/10 | 0/10 | 0/10 | 1/10 | 1/10 | 1/10 | 0/10 |
| L*a*b* | 14.7 | 13.2 | 12.5 | 12.1 | 13.4 | 13.1 | 13.2 | 13.4 | 13.0 |
| Electrical properties | 0/1000 | 0/1000 | 0/1000 | 0/1000 | 0/1000 | 0/1000 | 0/1000 | 0/1000 | 0/1000 |

TABLE 5

| | Example | | | | | | | | | |
|---|---|---|---|---|---|---|---|---|---|---|
| Item | 10 | 11 | 12 | 13 | 14 | 15 | 16 | 17 | 18 | 19 |
| Fluidity (cm) | 128 | 122 | 117 | 130 | 120 | 120 | 116 | 122 | 125 | 121 |
| Hot hardness | 84 | 82 | 82 | 82 | 82 | 82 | 85 | 82 | 78 | 81 |
| Storage stability (%) | 99 | 100 | 90 | 90 | 91 | 90 | 90 | 92 | 92 | 90 |
| Combined afterflame time (s) | 43 | 30 | 21 | 11 | 38 | 36 | 26 | 34 | 8 | 10 |
| Reflow resistance | 0/10 | 0/10 | 2/10 | 0/10 | 0/10 | 0/10 | 0/10 | 0/10 | 0/10 | 0/10 |
| L*a*b* | 12.8 | 12.7 | 13.9 | 13.9 | 14.0 | 12.9 | 13.0 | 13.3 | 14.2 | 14.5 |
| Electrical properties | 0/1000 | 0/1000 | 0/1000 | 0/1000 | 0/1000 | 0/1000 | 0/1000 | 0/1000 | 0/1000 | 0/1000 |

TABLE 6

| Item | Comparative Example | | | | | | | | |
| --- | --- | --- | --- | --- | --- | --- | --- | --- | --- |
| | 1 | 2 | 3 | 4 | 5 | 6 | 7 | 8 | 9 |
| Fluidity (cm) | 120 | 114 | 131 | 120 | 116 | 128 | 122 | 120 | 120 |
| Hot hardness | 82 | 84 | 85 | 83 | 81 | 84 | 82 | 82 | 81 |
| Storage stability (%) | 90 | 90 | 93 | 93 | 95 | 98 | 100 | 91 | 92 |
| Combined afterflame time (s) | 38 | 28 | 33 | 40 | 37 | 43 | 34 | 40 | 34 |
| Reflow resistance | 0/10 | 0/10 | 2/10 | 1/10 | 0/10 | 0/10 | 0/10 | 0/10 | 0/10 |
| L*a*b* | 14.7 | 13.5 | 13.5 | 14.0 | 14.0 | 13.4 | 13.4 | 17.2 | 13.9 |
| Electrical properties | 3/1000 | 5/1000 | 4/1000 | 2/1000 | 2/1000 | 1/1000 | 1/1000 | 0/1000 | 2/1000 |

The molding materials of the comparative examples 1 to 9 that contained no pitch all exhibited inferior electrical properties. In contrast, the molding materials of each of the examples 1 through 19 exhibited excellent electrical properties, and when compared with the comparative example with the same resin composition, also displayed equal or superior performance in terms of moldability such as fluidity and hot hardness, storage stability, flame retardancy, reflow resistance, and coloring properties. The molding materials of the example 3 and the example 16, which also included black titanium oxide, and in which the combined weight of the mesophase microspheres and the black titanium oxide was within a range from 2 to 15% by weight relative to the epoxy resin, exhibited particular superior balance between moldability and coloring properties.

This application is based upon and claims the benefit of priority from prior Japanese Application 2003-413229 filed on Dec. 11, 2003, and prior Japanese Application 2004-260963 filed on Sep. 8, 2004; the entire contents of which are incorporated by reference herein.

It should be noted that, besides those already mentioned above, various modifications and variations can be made in the aforementioned embodiments without departing from the novel and advantageous features of the present invention. Accordingly, it is intended that all such modifications and variations are included within the scope of the appended claims.

The invention claimed is:

1. An epoxy resin molding material for sealing, comprising an epoxy resin, an epoxy resin curing agent, and a pitch, wherein the pitch comprises mesophase microspheres isolated from a mesophase pitch.

2. The epoxy resin molding material for sealing according to claim 1, wherein an electrical resistivity of the pitch is at least $1 \times 10^5 \Omega \cdot cm$.

3. The epoxy resin molding material for sealing according to claim 1, wherein a carbon content of the pitch is within a range from 88 to 96% by weight.

4. The epoxy resin molding material for sealing according to claim 1, further comprising one or more materials selected from the group consisting of phthalocyanine-based dyes, phthalocyanine-based pigments, aniline black, perylene black, black iron oxide, and black titanium oxide as a colorant that contains no pitch.

5. The epoxy resin molding material for sealing according to claim 4, wherein a combined quantity of the colorant that contains no pitch and the pitch is within a range from 2 to 15% by weight relative to the epoxy resin.

6. The epoxy resin molding material for sealing according to claim 4, wherein a quantity of the pitch relative to the combined quantity of the colorant that contains no pitch and the pitch is at least 30% by weight.

7. The epoxy resin molding material for sealing according to claim 1, comprising, as the epoxy resin, one or more resins selected from the group consisting of biphenyl type epoxy resins, bisphenol F type epoxy resins, thiodiphenol type epoxy resins, phenol-aralkyl type epoxy resins, and naphthol-aralkyl type epoxy resins.

8. The epoxy resin molding material for sealing according to claim 1, comprising, as the curing agent, one or more resins selected from the group consisting of phenol-aralkyl resins represented by a general formula (I) shown below and naphthol-aralkyl resins represented by a general formula (II) shown below:

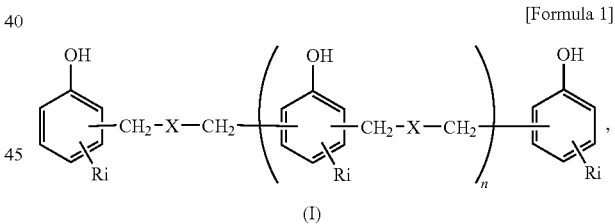

[Formula 1]

wherein; each R represents a hydrogen atom, or a substituted or unsubstituted monovalent hydrocarbon group of 1 to 12 carbon atoms, which may be all identical, or may be different, I represents either 0 or an integer from 1 to 3, X represents a bivalent organic group comprising an aromatic ring, and n represents either 0 or an integer from 1 to 10: and

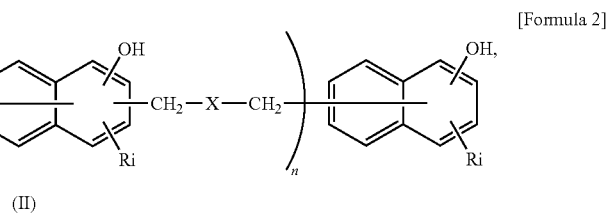

[Formula 2]

wherein each R represents a hydrogen atom, or a substituted or unsubstituted monovalent hydrocarbon group of 1 to 12 carbon atoms, which may be all identical, or may be different, l represents either 0 or an integer from 1 to 3, X represents a bivalent organic group comprising an aromatic ring, and n represents either 0 or an integer from 1 to 10.

9. The epoxy resin molding material for sealing according to claim 1, further comprising a cyclic phosphazene compound.

10. The epoxy resin molding material for sealing according to claim 9, wherein the cyclic phosphazene compound comprises a compound represented by a general formula (XVII) shown below:

[Formula 3]

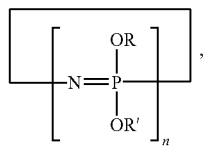

(XVII)

wherein n represents an integer from 3 to 5, and R and R' each represent an alkyl group of 1 to 4 carbon atoms or an aryl group, which may be either identical or different.

11. The epoxy resin molding material for sealing according to claim 10, wherein at least one of R and R' represents a hydroxyphenyl group, and a number of hydroxyphenyl groups is within a range from 1 to 10.

12. The epoxy resin molding material for sealing according to claim 9, comprising a cross-linked cyclic phosphazene compound.

13. An electronic component comprising an element that is sealed with the epoxy resin molding material for sealing according to claim 1.

* * * * *